United States Patent
Fujiwara et al.

(10) Patent No.: US 9,510,481 B2
(45) Date of Patent: Nov. 29, 2016

(54) REFRIGERANT JACKET AND AIR CONDITIONING APPARATUS EQUIPPED THEREWITH

(71) Applicant: DAIKIN INDUSTRIES, LTD., Osaka-si, Osaka (JP)

(72) Inventors: Masahide Fujiwara, Sakai (JP); Shinichi Ishizeki, Sakai (JP); Kentaroh Taoka, Sakai (JP); Shinichirou Nomura, Sakai (JP); Motonobu Ikeda, Sakai (JP); Hiroshi Dohmae, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 253 days.

(21) Appl. No.: 14/223,521

(22) Filed: Mar. 24, 2014

(65) Prior Publication Data

US 2015/0271953 A1    Sep. 24, 2015

(51) Int. Cl.
| | |
|---|---|
| *F25D 23/12* | (2006.01) |
| *H05K 7/20* | (2006.01) |
| *H01L 33/64* | (2010.01) |
| *H01L 31/052* | (2014.01) |
| *H01L 23/40* | (2006.01) |
| *H01L 23/473* | (2006.01) |

(52) U.S. Cl.
CPC .......... *H05K 7/20254* (2013.01); *H01L 23/40* (2013.01); *H01L 23/473* (2013.01); *H01L 31/052* (2013.01); *H01L 33/648* (2013.01); *H05K 7/20309* (2013.01); *H05K 7/20409* (2013.01); *H05K 7/20418* (2013.01); *H05K 7/20445* (2013.01); *H01L 2023/4087* (2013.01); *H01L 2924/0002* (2013.01)

(58) Field of Classification Search
CPC ... H01L 33/648; H01L 31/052; H01L 23/40; H01L 2023/4087; H05K 7/20254; H05K 7/20309; H05K 7/20409; H05K 7/20418; H05K 7/20445

USPC .......................................................... 62/259.2
See application file for complete search history.

(56) References Cited

U.S. PATENT DOCUMENTS

| | | | | |
|---|---|---|---|---|
| 4,720,981 A | * | 1/1988 | Helt .................. | F25B 40/00 165/80.4 |
| 6,859,367 B2 | * | 2/2005 | Davison .............. | H01L 23/4006 165/185 |
| 6,939,742 B2 | * | 9/2005 | Bhatia ................. | H01L 23/40 257/706 |

(Continued)

FOREIGN PATENT DOCUMENTS

JP        2013-42115 A      2/2013

*Primary Examiner* — Marc Norman
*Assistant Examiner* — David Teitelbaum
(74) *Attorney, Agent, or Firm* — Global IP Counselors

(57) ABSTRACT

A refrigerant jacket includes a refrigerant cooling member, a cover member and a strength member. The cooling member is constructed of aluminum or aluminum alloy that thermally contacts a heat emitting electrical part, and has a groove portion. A refrigerant tube of a refrigerant circuit fits into the groove portion. The cover member covers the refrigerant cooling member in a state where the refrigerant tube has been fitted into the groove portion. The strength member is higher in strength than the cooling member, and is fixed to the cooling member. The cover member has a cover-side through hole opposing the strength member. The strength member has a cover member fixing screw hole opposing the cover-side through hole. The cover member is fixed to the strength member by a cover member fixing screw that passes through the cover-side through hole and screws into threads of the cover member fixing screw hole.

8 Claims, 16 Drawing Sheets

(56) References Cited

U.S. PATENT DOCUMENTS

| | | | |
|---|---|---|---|
| 7,193,851 B2* | 3/2007 | Yatskov | H01L 23/4006 165/80.3 |
| 8,904,808 B2* | 12/2014 | Ghoshal | F25B 21/02 62/259.2 |
| 2003/0106326 A1* | 6/2003 | Sekimoto | F17C 3/085 62/51.1 |
| 2004/0057212 A1* | 3/2004 | Russell | H01L 23/4006 361/704 |
| 2009/0052483 A1* | 2/2009 | Lin | H01S 5/02236 372/36 |
| 2010/0327430 A1* | 12/2010 | Jadhav | H01L 23/3735 257/712 |
| 2011/0101700 A1* | 5/2011 | Stiesdal | H02K 1/148 290/55 |
| 2012/0168123 A1* | 7/2012 | Belgin | H01L 23/4338 165/80.2 |
| 2013/0058100 A1* | 3/2013 | DeRose | F21V 29/30 362/294 |
| 2014/0138073 A1 | 5/2014 | Teraki | |

* cited by examiner

REFRIGERANT JACKET AND AIR CONDITIONING APPARATUS EQUIPPED THEREWITH

BACKGROUND OF THE INVENTION

Field of the Invention

The present invention relates to a refrigerant jacket and to an air conditioning apparatus equipped therewith, and particularly relates to a refrigerant jacket that uses refrigerant circulating through a refrigerant circuit to cool a heat emitting electrical part and to an air conditioning apparatus equipped therewith.

Background Art

Conventionally, a refrigerant jacket that uses refrigerant circulating through a refrigerant circuit to cool a heat emitting electrical part and an air conditioning apparatus equipped therewith have been known, such as those described in Japanese Patent Application Laid-open No. 2013-42115.

The refrigerant jacket has a refrigerant cooling member and a cover member. The refrigerant cooling member is a member made of aluminum that thermally contacts the heat emitting electrical part and in which are formed groove portions into which a refrigerant tube configuring the refrigerant circuit fits. The cover member is a member that covers the refrigerant cooling member in a state in which the refrigerant tube has been fitted into the groove portions.

SUMMARY

In the conventional refrigerant jacket, a screw hole (a cover member fixing screw hole) having threads is formed in the refrigerant cooling member made of aluminum, and the cover member is fastened and fixed to the refrigerant cooling member by a screw (a cover member fixing screw) that screws into the cover member fixing screw hole.

However, in this screwing structure, sometimes the threads of the cover member fixing screw hole end up stripping due to repeated screwing and excessive tightening of the cover member fixing screw, so that faulty fastening of the cover member to the refrigerant cooling member occurs. Additionally, when such faulty fastening occurs, the close contact between the refrigerant tube and the groove portions of the refrigerant cooling member becomes insufficient, and there is the concern that the required refrigerant cooling performance will not be obtained.

For this reason, ensuring that the threads of the cover member fixing screw hole do not strip even due to repeated screwing and excessive tightening of the cover member fixing screw and making it possible for the cover member to be fixed to the refrigerant cooling member in a state in which the refrigerant tube and the groove portions of the refrigerant cooling member are in sufficiently close contact with one another is preferred.

Therefore, in a refrigerant jacket pertaining to the present invention, a strength member higher in strength than the refrigerant cooling member is fixed to the refrigerant cooling member, a cover member fixing screw hole is formed in the strength member, and the cover member is fastened and fixed to the strength member by a cover member fixing screw.

Specifically, a refrigerant jacket pertaining to a first aspect is a refrigerant jacket that uses refrigerant circulating through a refrigerant circuit to cool a heat emitting electrical part. The refrigerant jacket has a refrigerant cooling member and a cover member. The refrigerant cooling member is a member made of aluminum or aluminum alloy that thermally contacts the heat emitting electrical part and in which is formed a groove portion into which a refrigerant tube configuring the refrigerant circuit fits. The cover member is a member that covers the refrigerant cooling member in a state in which the refrigerant tube has been fitted into the groove portion. Additionally, a strength member higher in strength than the refrigerant cooling member is fixed to the refrigerant cooling member. A cover-side through hole including a through hole is formed in the cover member in a position opposing the strength member. A cover member fixing screw hole including a screw hole having threads is formed in the strength member in a position opposing the cover-side through hole. The cover member is fastened and fixed to the strength member by a cover member fixing screw including a screw that passes through the cover-side through hole and screws into the cover member fixing screw hole.

Because of this, here, the threads of the cover member fixing screw hole no longer strip even due to repeated screwing and excessive tightening of the cover member fixing screw, and the cover member can be fixed to the refrigerant cooling member in a state in which the refrigerant tube and the groove portion of the refrigerant cooling member are in sufficiently close contact with one another.

A refrigerant jacket pertaining to a second aspect is the refrigerant jacket pertaining to the first aspect, wherein the strength member is a member that does not electrically corrode even when it contacts the refrigerant cooling member, the cover member, and the refrigerant tube.

Because of this, here, damage caused by electrical corrosion of the refrigerant jacket can be suppressed.

A refrigerant jacket pertaining to a third aspect is the refrigerant jacket pertaining to the first or second aspect, wherein the cover member fixing screw hole penetrates the strength member. A first refrigerant cooling-side recessed portion including a recess or through hole is formed in the refrigerant cooling member in a position opposing the cover member fixing screw hole.

Because of this, here, the hole depth of the cover member fixing screw hole can be increased and the distal end portion of the cover member fixing screw can be accommodated in the first refrigerant cooling-side recessed portion. Additionally, the fastening strength between the cover member and the strength member can be improved and interference between the cover member fixing screw and the refrigerant cooling member can be avoided.

A refrigerant jacket pertaining to a fourth aspect is the refrigerant jacket pertaining to any of the first to third aspects, wherein a strength-side through hole including a through hole is formed in the strength member in a position opposing the refrigerant cooling member. A strength member fixing screw hole including a screw hole having threads is formed in the refrigerant cooling member in a position opposing the strength-side through hole. The strength member is fixed to the refrigerant cooling member as a result of being fastened by a strength member fixing screw including a screw that passes through the strength-side through hole and screws into the strength member fixing screw hole.

Because of this, here, the strength member can be strongly and easily fixed to the refrigerant cooling member.

A refrigerant jacket pertaining to a fifth aspect is the refrigerant jacket pertaining to the fourth aspect, wherein a first strength-side recessed portion including a recess that accommodates a head portion of the strength member fixing screw in a state in which the strength member has been fastened and fixed to the refrigerant cooling member is formed in the strength member.

Because of this, here, interference between the head portion of the strength member fixing screw and the cover member can be avoided.

A refrigerant jacket pertaining to a sixth aspect is the refrigerant jacket pertaining to any of the first to third aspects, wherein a second refrigerant cooling-side recessed portion including a recess into which the strength member fits is formed in the refrigerant cooling member. The strength member is fixed to the refrigerant cooling member as a result of being press-fitted into the second refrigerant cooling-side recessed portion.

Because of this, here, the strength member can be strongly and easily fixed to the refrigerant cooling member.

A refrigerant jacket pertaining to a seventh aspect is the refrigerant jacket pertaining to any of the first to fifth aspects, wherein a heat emitting electrical part fixing screw hole including a screw hole having threads is formed in the refrigerant cooling member in a position opposing the heat emitting electrical part. The heat emitting electrical part is fastened and fixed to the refrigerant cooling member by a heat emitting electrical part fixing screw including a screw that screws into the heat emitting electrical part fixing screw hole. The heat emitting electrical part fixing screw hole penetrates the refrigerant cooling member. A second strength-side recessed portion including a recess or through hole is formed in the strength member in a position opposing the heat emitting electrical part fixing screw hole.

Because of this, here, the hole depth of the heat emitting electrical part fixing screw hole can be increased and the distal end portion of the heat emitting electrical part fixing screw can be accommodated in the second strength-side recessed portion. Additionally, the fastening strength between the refrigerant cooling member and the heat emitting electrical part can be improved and interference between the heat emitting electrical part fixing screw and the strength member can be avoided.

An air conditioning apparatus pertaining to an eighth aspect has a refrigerant circuit, a heat emitting electrical part, and the refrigerant jacket pertaining to any of the first to seventh aspects.

Because of this, here, the threads of the cover member fixing screw hole no longer strip even due to repeated screwing and excessive tightening of the cover member fixing screw, and the cover member can be fixed to the refrigerant cooling member in a state in which the refrigerant tube and the groove portion of the refrigerant cooling member are in sufficiently close contact with one another.

DETAILED DESCRIPTION OF EMBODIMENT(S)

An embodiment of a refrigerant jacket pertaining to the present invention and an air conditioning apparatus equipped therewith, as well as an example modification thereof, will be described below on the basis of the drawings. The specific configurations of the refrigerant jacket pertaining to the present invention and the air conditioning apparatus equipped therewith are not limited to the configurations in the following embodiment and example modification thereof and can be changed without departing from the gist of the invention.

(1) Configuration of Air Conditioning Apparatus

Figure 1:
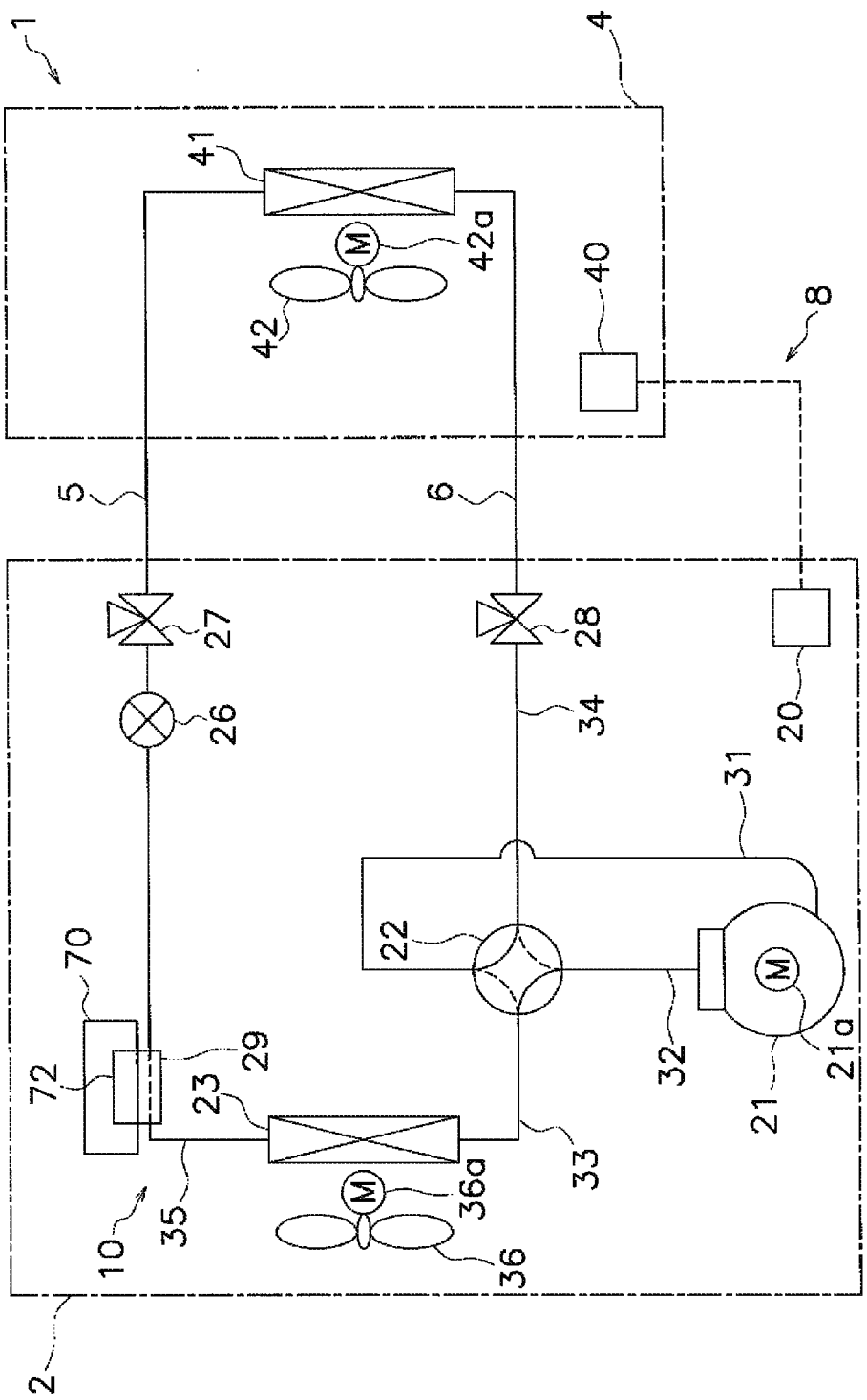
FIG. 1 is a schematic configuration diagram of an air conditioning apparatus equipped with a refrigerant jacket pertaining to the present invention.

FIG. 1 is a schematic configuration diagram of an air conditioning apparatus 1 equipped with a refrigerant jacket pertaining to the present invention.

The air conditioning apparatus 1 is an apparatus that can cool and heat a room in a building or the like by performing a vapor compression refrigeration cycle. The air conditioning apparatus 1 is configured mainly as a result of an outdoor unit 2 and an indoor unit 4 being interconnected. Here, the outdoor unit 2 and the indoor unit 4 are interconnected via a liquid refrigerant connection tube 5 and a gas refrigerant connection tube 6. That is, a vapor compression refrigerant circuit 10 of the air conditioning apparatus 1 is configured as a result of the outdoor unit 2 and the indoor unit 4 being interconnected via the refrigerant connection tubes 5 and 6.

Indoor Unit

The indoor unit 4 is installed in a room and configures part of the refrigerant circuit 10. The indoor unit 4 mainly has an indoor heat exchanger 41.

The indoor heat exchanger 41 is a heat exchanger which, during a cooling operation, functions as an evaporator of refrigerant to cool the room air and, during a heating operation, functions as a radiator of the refrigerant to heat the room air. The liquid side of the indoor heat exchanger 41 is connected to the liquid refrigerant connection tube 5, and the gas side of the indoor heat exchanger 41 is connected to the gas refrigerant connection tube 6.

The indoor unit 4 has an indoor fan 42 for sucking room air into the indoor unit 4, causing the room air to exchange heat with the refrigerant in the indoor heat exchanger 41, and thereafter supplying the air to the room as supply air. That is, the indoor unit 4 has the indoor fan 42 as a fan that supplies, to the indoor heat exchanger 41, room air serving as a heating source or a cooling source of the refrigerant flowing through the indoor heat exchanger 41. Here, for example, a centrifugal fan or a multi-blade fan driven by an indoor fan motor 42a is used as the indoor fan 42.

The indoor unit 4 has an indoor-side control unit 40 that controls the actions of each part configuring the indoor unit 4. Additionally, the indoor-side control unit 40 has a microcomputer and a memory and the like disposed in order to control the indoor unit 4, and the indoor-side control unit 40 can exchange control signals and so forth with a remote controller (not shown in the drawings) and exchange control signals and so forth with the outdoor unit 2.

Outdoor Unit

The outdoor unit 2 is installed outdoors and configures part of the refrigerant circuit 10. The outdoor unit 2 mainly has a compressor 21, a four-way switching valve 22, an outdoor heat exchanger 23, a refrigerant jacket 29, an expansion valve 26, a liquid-side stop valve 27, and a gas-side stop valve 28.

The compressor 21 is a device that compresses the low-pressure refrigerant in the refrigeration cycle to a high pressure. The compressor 21 has a closed structure where such as a rotary or scroll positive-displacement compression element (not shown in the drawings) is driven to rotate by a compressor motor 21a whose frequency (speed) can be controlled by an inverter. That is, the compressor 21 is configured in such a way that its operating capacity can be controlled by varying its frequency (speed). A suction tube 31 is connected to the suction side of the compressor 21, and a discharge tube 32 is connected to the discharge side of the compressor 21. The suction tube 31 is a refrigerant tube that interconnects the suction side of the compressor 21 and the four-way switching valve 22. The discharge tube 32 is a refrigerant tube that interconnects the discharge side of the compressor 21 and the four-way switching valve 22.

The four-way switching valve 22 is a switching valve for switching the direction of the flow of the refrigerant in the refrigerant circuit 10. During the cooling operation, the four-way switching valve 22 switches to a cooling cycle state in which the outdoor heat exchanger 23 is caused to function as a radiator of the refrigerant that has been compressed in the compressor 21 and the indoor heat exchanger 41 is caused to function as an evaporator of the refrigerant that has released heat in the outdoor heat exchanger 23. That is, during the cooling operation, the four-way switching valve 22 interconnects the discharge side of the compressor 21 (here, the discharge tube 32) and the gas side of the outdoor heat exchanger 23 (here, a first gas refrigerant tube 33) (see the solid line of the four-way switching valve 22 in FIG. 1). The four-way switching valve 22 also interconnects the suction side of the compressor 21 (here, the suction tube 31) and the gas refrigerant connection tube 6 side (here, a second gas refrigerant tube 34) (see the solid line of the four-way switching valve 22 in FIG. 1). Furthermore, during the heating operation, the four-way switching valve 22 switches to a heating cycle state in which the outdoor heat exchanger 23 is caused to function as an evaporator of the refrigerant that has released heat in the indoor heat exchanger 41 and the indoor heat exchanger 41 is caused to function as a radiator of the refrigerant that has been compressed in the compressor 21. That is, during the heating operation, the four-way switching valve 22 interconnects the discharge side of the compressor 21 (here, the discharge tube 32) and the gas refrigerant connection tube 6 side (here, the second gas refrigerant tube 34) (see the dashed line of the four-way switching valve in FIG. 1). The four-way switching valve 22 also interconnects the suction side of the compressor 21 (here, the suction tube 31) and the gas side of the outdoor heat exchanger 23 (here, the first gas refrigerant tube 33) (see the dashed line of the four-way switching valve in FIG. 1). Here, the first gas refrigerant tube 33 is a refrigerant tube that interconnects the four-way switching valve 22 and the gas side of the outdoor heat exchanger 23. The second gas refrigerant tube 34 is a refrigerant tube that interconnects the four-way switching valve 22 and the gas-side stop valve 28.

The outdoor heat exchanger 23 is a heat exchanger which, during the cooling operation, functions as a radiator of the refrigerant using outdoor air as a cooling source and, during the heating operation, functions as an evaporator of the refrigerant using outdoor air as a heating source. The liquid side of the outdoor heat exchanger 23 is connected to a liquid refrigerant tube 35, and the gas side of the outdoor heat exchanger 23 is connected to the first gas refrigerant tube 33. The liquid refrigerant tube 35 is a refrigerant tube that interconnects the liquid side of the outdoor heat exchanger 23 and the liquid refrigerant connection tube 5 side.

The expansion valve 26 is a valve which, during the cooling operation, reduces the pressure of the high-pressure refrigerant in the refrigeration cycle that has released heat in the outdoor heat exchanger 23 to a low pressure in the refrigeration cycle. Furthermore, the expansion valve 26 is a valve which, during the heating operation, reduces the pressure of the high-pressure refrigerant in the refrigeration cycle that has released heat in the indoor heat exchanger 41 to a low pressure in the refrigeration cycle. The expansion valve 26 is disposed in a section of the liquid refrigerant tube 35 near the liquid-side stop valve 27. Here, an electrically powered expansion valve is used as the expansion valve 26.

The refrigerant jacket 29 is a heat exchanger that uses the refrigerant circulating through the refrigerant circuit 10 (here, the refrigerant flowing through the refrigerant tube 35) to cool electrical parts 72 (heat emitting electrical parts) that emit a lot of heat—such as power elements—and configure a later-described electrical component unit 70. That is, during the cooling operation, the refrigerant jacket 29 functions as a heat exchanger that cools the heat emitting electrical parts 72 using the high-pressure refrigerant in the refrigeration cycle after the refrigerant has released its heat in the outdoor heat exchanger 23 (that is, the refrigerant flowing between the outdoor heat exchanger 23 and the expansion valve 26), and during the heating operation, the refrigerant jacket 29 functions as a heat exchanger that cools the heat emitting electrical parts 72 using the low-pressure refrigerant in the refrigeration cycle after its pressure has been reduced by the expansion valve 26 (that is, the refrigerant flowing between the expansion valve 26 and the outdoor heat exchanger 23).

The liquid-side stop valve 27 and the gas-side stop valve 28 are valves disposed in openings that connect to external devices and tubes (specifically, the liquid refrigerant connection tube 5 and the gas refrigerant connection tube 6). The liquid-side stop valve 27 is disposed on the end portion of the liquid refrigerant tube 35. The gas-side stop valve 28 is disposed on the end portion of the second gas refrigerant tube 34.

The outdoor unit 2 has an outdoor fan 36 for sucking outdoor air into the outdoor unit 2, causing the outdoor air to exchange heat with the refrigerant in the outdoor heat exchanger 23, and thereafter expelling the air to the outside. That is, the outdoor unit 2 has the outdoor fan 36 as a fan that supplies, to the outdoor heat exchanger 23, outdoor air serving as a cooling source or a heating source of the refrigerant flowing through the outdoor heat exchanger 23. Here, for example, a propeller fan driven by an outdoor fan motor 36a is used as the outdoor fan 36.

The outdoor unit 2 has an outdoor-side control unit 20 that controls the actions of each part configuring the outdoor unit 2. Additionally, the outdoor-side control unit 20 has a microcomputer and a memory and the like disposed in order to control the outdoor unit 2, and the outdoor-side control unit 20 can exchange control signals and so forth with the indoor unit 4 (that is, the indoor-side control unit 40). The outdoor-side control unit 20 is configured by the later-described electrical component unit 70.

Refrigerant Connection Tubes

The refrigerant connection tubes 5 and 6 are refrigerant tubes constructed on site when installing the air conditioning apparatus 1 in the installation site such as a building, and tubes having various lengths and tube diameters are used in accordance with installation conditions such as the installation site and the combination of the outdoor unit and the indoor unit.

As described above, the refrigerant circuit 10 of the air conditioning apparatus 1 is configured as a result of the outdoor unit 2, the indoor unit 4, and the refrigerant connection tubes 5 and 6 being interconnected. The refrigerant circuit 10 is configured mainly as a result of the compressor 21, the outdoor heat exchanger 23 functioning as a radiator or evaporator, the refrigerant jacket 29, the expansion valve 26, and the indoor heat exchanger 41 functioning as an evaporator or radiator being interconnected. Additionally, the refrigerant circuit 10 performs the cooling operation as a refrigeration cycle operation that causes the refrigerant to circulate in the order of the compressor 21, the outdoor heat exchanger 23 functioning as a radiator, the expansion valve 26, and the indoor heat exchanger 41 functioning as an evaporator. When the refrigerant circuit 10 performs this cooling operation, the refrigerant jacket 29 uses the high-pressure refrigerant in the refrigeration cycle flowing between the outdoor heat exchanger 23 and the expansion valve 26 to cool the heat emitting electrical parts 72. Furthermore, the refrigerant circuit 10 performs the heating operation as a refrigeration cycle operation that causes the refrigerant to circulate in the order of the compressor 21, the indoor heat exchanger 41 functioning as a radiator, the expansion valve 26, and the outdoor heat exchanger 23 functioning as an evaporator. When the refrigerant circuit 10 performs this heating operation, the refrigerant jacket 29 uses the low-pressure refrigerant in the refrigeration cycle flowing between the expansion valve 26 and the outdoor heat exchanger 23 to cool the heat emitting electrical parts 72.

Control Unit

The air conditioning apparatus 1 can control each device in the outdoor unit 2 and indoor unit 4 using a control unit 8 configured from the indoor-side control unit 40 and the outdoor-side control unit 20. That is, a control unit 8 that controls the operations of the entire air conditioning apparatus 1 including the refrigeration cycle operations such as the cooling operation and the heating operation as described above is configured by the indoor-side control unit 40 and the outdoor-side control unit 20.

(2) Configuration of Outdoor Unit

Figure 2:
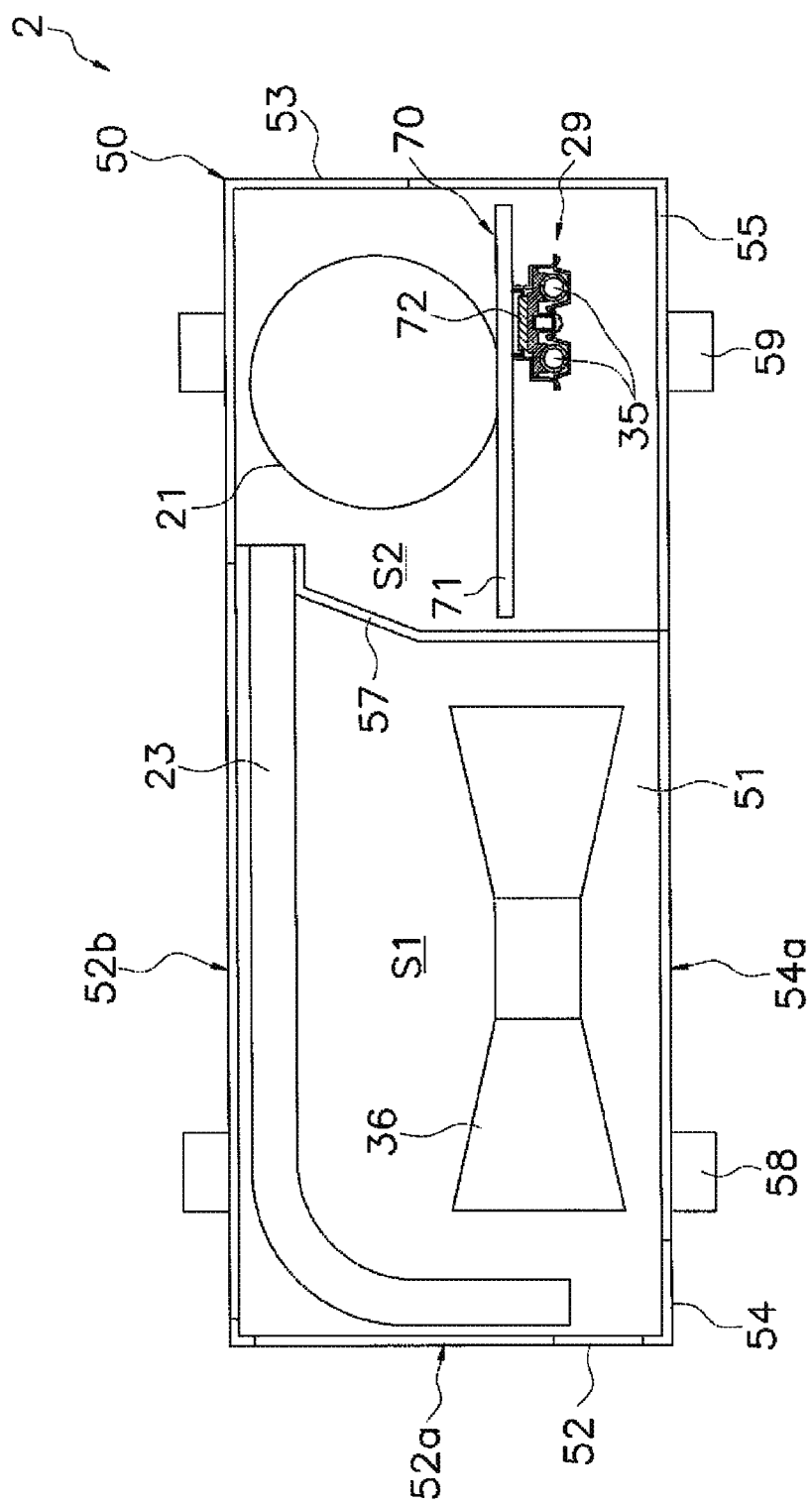
FIG. 2 is a plan sectional view of an outdoor unit.
Figure 3:
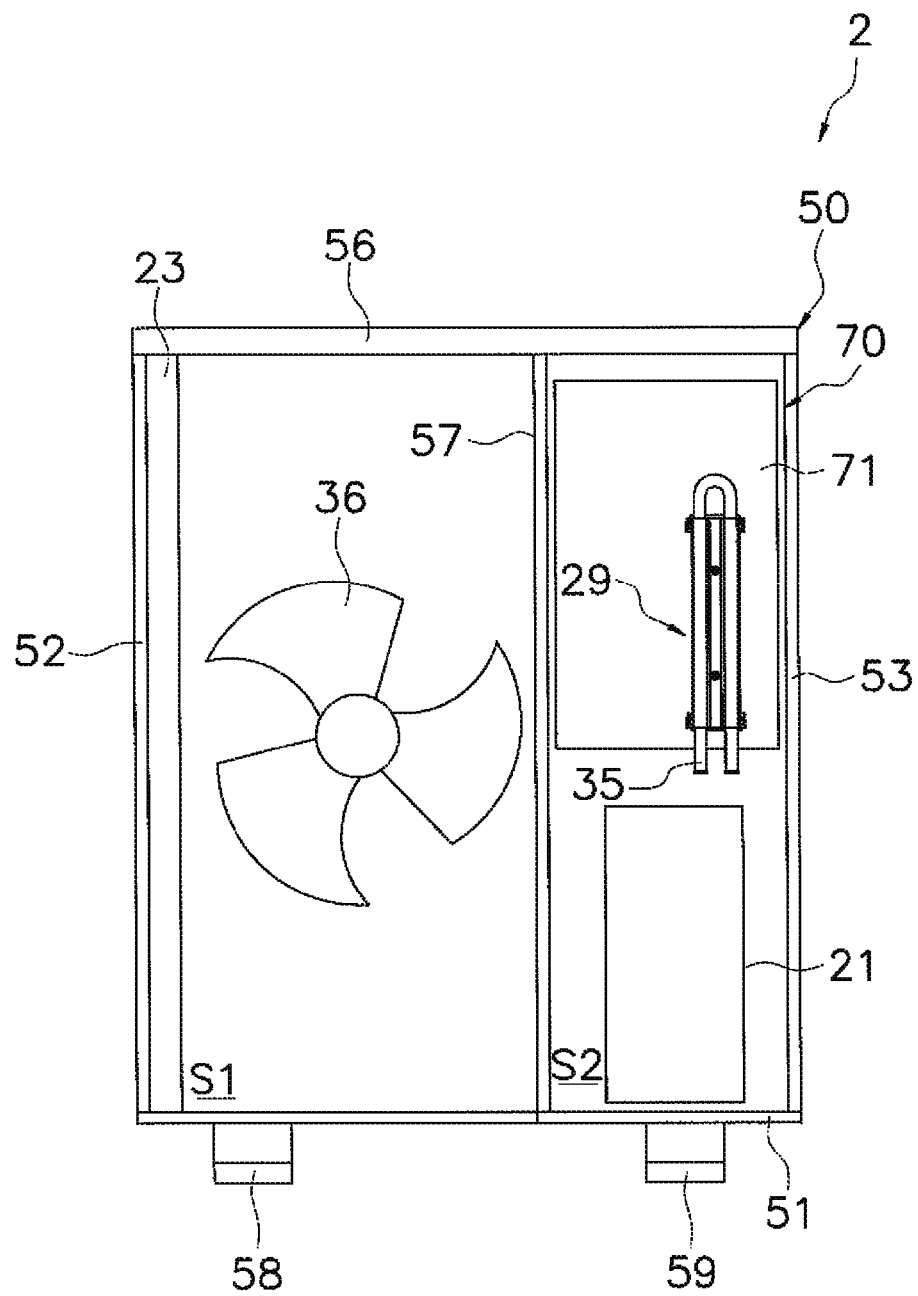
FIG. 3 is a front view of the outdoor unit showing a state in which a blower chamber-side front plate and a machine chamber-side front plate have been removed.

Next, the configuration of the outdoor unit 2 will be described using FIG. 2 and FIG. 3. Here, FIG. 2 is a plan sectional view of the outdoor unit 2. FIG. 3 is a front view of the outdoor unit 2 showing a state in which a blower chamber-side front plate 54 and a machine chamber-side front plate 55 have been removed. In the following description, expressions describing directions and surfaces—such as "upper," "lower," "left," and "right," as well as "front surface," "side surface," "back surface," "top surface," and "bottom surface"—will, unless otherwise indicated, mean directions and surfaces in a case where the outdoor unit 2 shown in FIG. 3 is viewed from the front.

The outdoor unit 2 has a structure (a so-called trunk structure) where a blower chamber S1 and a machine chamber S2 are formed as a result of the interior space of a unit casing 50 being divided into a left space and a right space by a partition plate 57 extending in the vertical direction. The outdoor unit 2 is configured to suck outdoor air inside from parts of the back surface and a side surface of the unit casing 50 and thereafter expel the air from the front surface of the unit casing 50. The outdoor unit 2 mainly has the unit casing 50; refrigerant circuit constituent parts including the compressor 21, the four-way switching valve 22, the outdoor heat exchanger 23, the expansion valve 26, the refrigerant jacket 29, the stop valves 27 and 28, and the refrigerant tubes 31 to 35 interconnecting these devices; the outdoor fan 36; and the electrical component unit 70 in which plural electrical components are disposed. Here, an example is described where the blower chamber S1 is formed near the left side surface of the unit casing 50 and the machine chamber S2 is formed near the right side surface of the unit casing 50, but these may also be reversed.

The unit casing 50 is formed in the shape of a substantial cuboid and mainly accommodates the refrigerant circuit constituent parts 21 to 28, the outdoor fan 36, and the electrical component unit 70. The unit casing 50 has a bottom plate 51, a blower chamber-side side plate 52, a machine chamber-side side plate 53, a blower chamber-side front plate 54, a machine chamber-side front plate 55, and a top plate 56.

The bottom plate 51 is a plate-like member that configures the bottom surface section of the unit casing 50. Base legs 58 and 59 fixed to an on-site installation surface are disposed on the underside of the bottom plate 51.

The blower chamber-side side plate 52 is a plate-like member that configures the side surface section of the unit casing 50 near the blower chamber S1. The lower portion of the blower chamber-side side plate 52 is fixed to the bottom plate 51. An air inlet 52a for outdoor air sucked into the unit casing 50 by the outdoor fan 36 is formed in the blower chamber-side side plate 52.

The machine chamber-side side plate 53 is a plate-like member that configures part of the side surface section of the unit casing 50 near the machine chamber S2 and the back surface section of the unit casing 50 near the machine chamber S2. The lower portion of the machine chamber-side side plate 53 is fixed to the bottom plate 51. An air inlet 52b for outdoor air sucked into the unit casing 50 by the outdoor fan 36 is formed between the end portion of the blower chamber-side side plate 52 on the back surface side and the end portion of the machine chamber-side side plate 53 on the blower chamber S1 side.

The blower chamber-side front plate 54 is a plate-like member that configures the front surface section of the blower chamber S1 of the unit casing 50. The lower portion of the blower chamber-side front plate 54 is fixed to the bottom plate 51, and the end portion of the blower chamber-side front plate 54 on the left side surface side is fixed to the end portion of the blower chamber-side side plate 52 on the front surface side. An air outlet 54a for blowing out, to the outside, the outdoor air that has been taken into the unit casing 50 by the outdoor fan 36 is disposed in the blower chamber-side front plate 54.

The machine chamber-side front plate 55 is a plate-like member that configures part of the front surface section of the machine chamber S2 of the unit casing 50 and part of the side surface section of the machine chamber S2 of the unit casing 50. The end portion of the machine chamber-side front plate 55 on the blower chamber S1 side is fixed to the end portion of the blower chamber-side front plate 54 on the machine chamber S2 side, and the end portion of the machine chamber-side front plate 55 on the back surface side is fixed to the end portion of the machine chamber-side side plate 53 on the front surface side.

The top plate 56 is a plate-like member that configures the top surface section of the unit casing 50. The top plate 56 is fixed to the blower chamber side-side plate 52, the machine chamber-side side plate 53, and the blower chamber-side front plate 54.

The partition plate 57 is a plate-like member that is disposed on the bottom plate 51 and extends in the vertical direction. The partition plate 57 partitions the interior space of the unit casing 50 into a left space and a right space to thereby form the blower chamber S1 near the left side surface and the machine chamber S2 near the right side surface. The lower portion of the partition plate 57 is fixed to the bottom plate 51, the end portion of the partition plate 57 on the front surface side is fixed to the blower chamber-side front plate 54, and the end portion of the partition plate 57 on the back surface side is fixed to the end portion of the outdoor heat exchanger 23 on the machine chamber S2 side.

The outdoor fan 36 is disposed in the blower chamber S1 in a position on the front surface side of the outdoor heat exchanger 23 in such a way as to face the air outlet 54a.

The outdoor heat exchanger 23 is a substantially L-shaped heat exchanger panel and is disposed in the blower chamber S1 along the left side surface and back surface of the unit casing 50.

The compressor 21 is a vertical cylinder-shaped closed compressor and is disposed in the machine chamber S2.

The electrical component unit 70 is disposed in the machine chamber S2 in such a way as to be positioned near the front surface of the unit casing 50. The electrical component unit 70 is a unit in which plural electrical components used such as to control the devices in the outdoor unit 2 are disposed and configures the outdoor-side control unit 20. The electrical component unit 70 mainly has a base plate 71 and plural electrical components including the heat emitting electrical parts 72 such as a power element configuring the inverter of the compressor motor 21a. The heat emitting electrical parts 72 are mounted on the front surface of the base plate 71.

The refrigerant jacket 29 here is a member with a vertically long shape along the lengthwise direction of a section of the liquid refrigerant tube 35 bent in a U-shape, and the refrigerant jacket 29 is supported on the base plate 71. The refrigerant jacket 29 has a structure where the liquid refrigerant tube 35, which is bent in a U-shape in such a way as to turn around in the up and down direction, is attached to it. The refrigerant jacket 29 is disposed in such a way as to cover, from the front, the heat emitting electrical parts 72 mounted on the base plate 71 and thermally contacts the heat emitting electrical parts 72.

Although it is not shown in the drawings here, the refrigerant circuit constituent parts such as the four-way switching valve 22 and the expansion valve 26 are also disposed in the unit casing 50. Furthermore, the detailed structure of the refrigerant jacket 29 will be described below.

(3) Actions of Air Conditioning Apparatus

Next, the actions of the air conditioning apparatus 1 will be described using FIG. 1. The air conditioning apparatus 1 can perform the cooling operation and the heating operation while using the refrigerant jacket 29 to cool the heat emitting electrical parts 72. The cooling operation and the heating operation are performed by the control unit 8.

Cooling Operation

During the cooling operation, the four-way switching valve 22 is switched to the cooling cycle state (the state indicated by the solid lines in FIG. 1).

In the refrigerant circuit 10, the low-pressure gas refrigerant in the refrigeration cycle is sucked into the compressor 21, compressed to a high pressure in the refrigeration cycle, and thereafter discharged.

The high-pressure gas refrigerant that has been discharged from the compressor 21 is sent through the four-way switching valve 22 to the outdoor heat exchanger 23.

The high-pressure gas refrigerant that has been sent to the outdoor heat exchanger 23 exchanges heat with outdoor air supplied as a cooling source by the outdoor fan 36, releases heat, and becomes high-pressure liquid refrigerant in the outdoor heat exchanger 23.

The high-pressure liquid refrigerant that has released heat in the outdoor heat exchanger 23 is sent to the refrigerant jacket 29.

The high-pressure liquid refrigerant that has been sent to the refrigerant jacket 29 exchanges heat with the heat emitting electrical parts 72 and is heated. At this time, the heat emitting electrical parts 72 become cooled in accordance with the flow rate (that is, the refrigerant circulation amount) and temperature of the high-pressure liquid refrigerant flowing through the refrigerant jacket 29.

The high-pressure liquid refrigerant that has been heated in the refrigerant jacket 29 is sent to the expansion valve 26.

The high-pressure liquid refrigerant that has been sent to the expansion valve 26 has its pressure reduced to a low pressure in the refrigeration cycle by the expansion valve 26 and becomes low-pressure refrigerant in a gas-liquid two-phase state. The low-pressure refrigerant in the gas-liquid two-phase state whose pressure has been reduced by the expansion valve 26 is sent through the liquid-side stop valve 27 and the liquid refrigerant connection tube 5 to the indoor heat exchanger 41.

The low-pressure refrigerant in the gas-liquid two-phase state that has been sent to the indoor heat exchanger 41 exchanges heat with room air supplied as a heating source by the indoor fan 42 and evaporates in the indoor heat exchanger 41. Because of this, the room air is cooled and thereafter supplied to the room, whereby the room is cooled.

The low-pressure gas refrigerant that has evaporated in the indoor heat exchanger 41 travels through the gas refrigerant connection tube 6, the gas-side stop valve 28, and the four-way switching valve 22 and is sucked back into the compressor 21.

Heating Operation

During the heating operation, the four-way switching valve 22 is switched to the heating cycle state (the state indicated by the dashed lines in FIG. 1).

In the refrigerant circuit 10, the low-pressure gas refrigerant in the refrigeration cycle is sucked into the compressor 21, compressed to a high pressure in the refrigeration cycle, and thereafter discharged.

The high-pressure gas refrigerant that has been discharged from the compressor 21 is sent through the four-way switching valve 22, the gas-side stop valve 28, and the gas refrigerant connection tube 6 to the indoor heat exchanger 41.

The high-pressure gas refrigerant that has been sent to the indoor heat exchanger 41 exchanges heat with room air supplied as a cooling source by the indoor fan 42, releases heat, and becomes high-pressure liquid refrigerant in the indoor heat exchanger 41. Because of this, the room air is heated and thereafter supplied to the room, whereby the room is heated.

The high-pressure liquid refrigerant that has released heat in the indoor heat exchanger 41 is sent through the liquid refrigerant connection tube 5 and the liquid-side stop valve 27 to the expansion valve 26.

The high-pressure liquid refrigerant that has been sent to the expansion valve 26 has its pressure reduced to a low pressure in the refrigeration cycle by the expansion valve 26 and becomes low-pressure refrigerant in a gas-liquid two-phase state. The low-pressure refrigerant in the gas-liquid two-phase state whose pressure has been reduced by the expansion valve 26 is sent to the refrigerant jacket 29.

The low-pressure refrigerant in the gas-liquid two-phase state that has been sent to the refrigerant jacket 29 exchanges heat with the heat emitting electrical parts 72 and is heated. At this time, the heat emitting electrical parts 72 become cooled in accordance with the flow rate (that is, the refrigerant circulation amount) and temperature of the low-pressure refrigerant in the gas-liquid two-phase state flowing through the refrigerant jacket 29.

The low-pressure refrigerant in the gas-liquid two-phase state that has been heated in the refrigerant jacket 29 is sent to the outdoor heat exchanger 23.

The low-pressure refrigerant in the gas-liquid two-phase state that has been sent to the outdoor heat exchanger 23 exchanges heat with outdoor air supplied as a heating source by the outdoor fan 36, evaporates, and becomes low-pressure gas refrigerant in the outdoor heat exchanger 23.

The low-pressure refrigerant that has evaporated in the outdoor heat exchanger 23 travels through the four-way switching valve 22 and is sucked back into the compressor 21.

(4) Structure of Refrigerant Jacket

Figure 4:
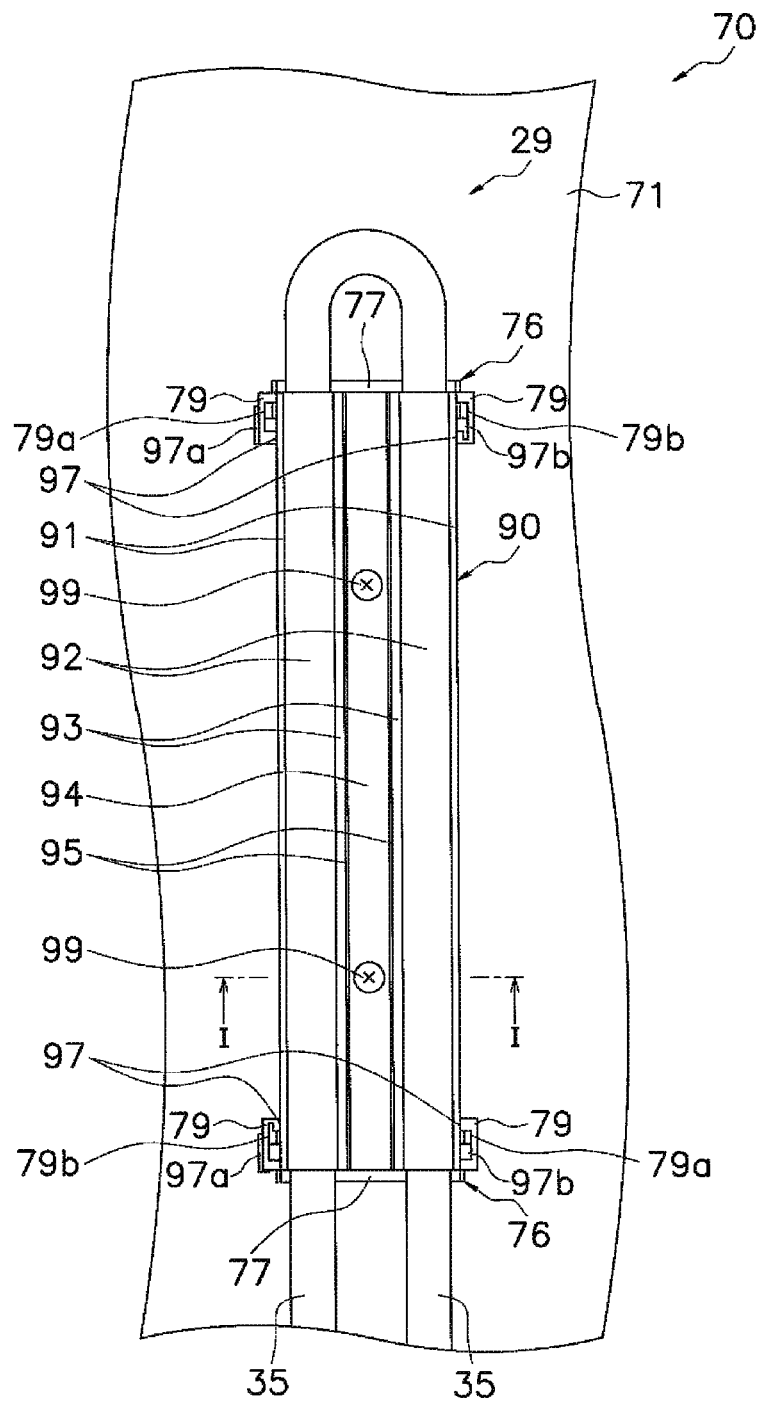
FIG. 4 is a front view of the refrigerant jacket.
Figure 5:
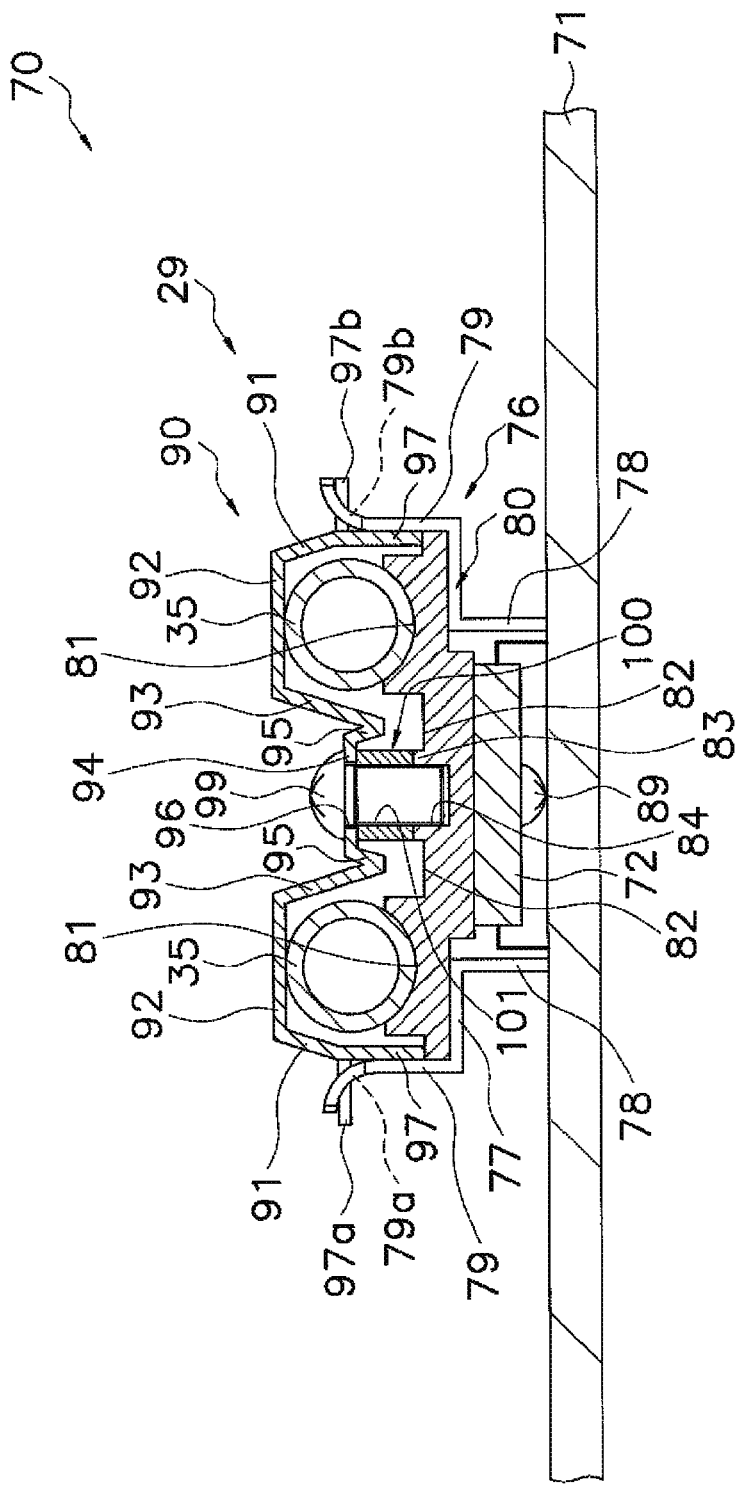
FIG. 5 is a sectional view taken along line I-I of FIG. 4.
Figure 6:
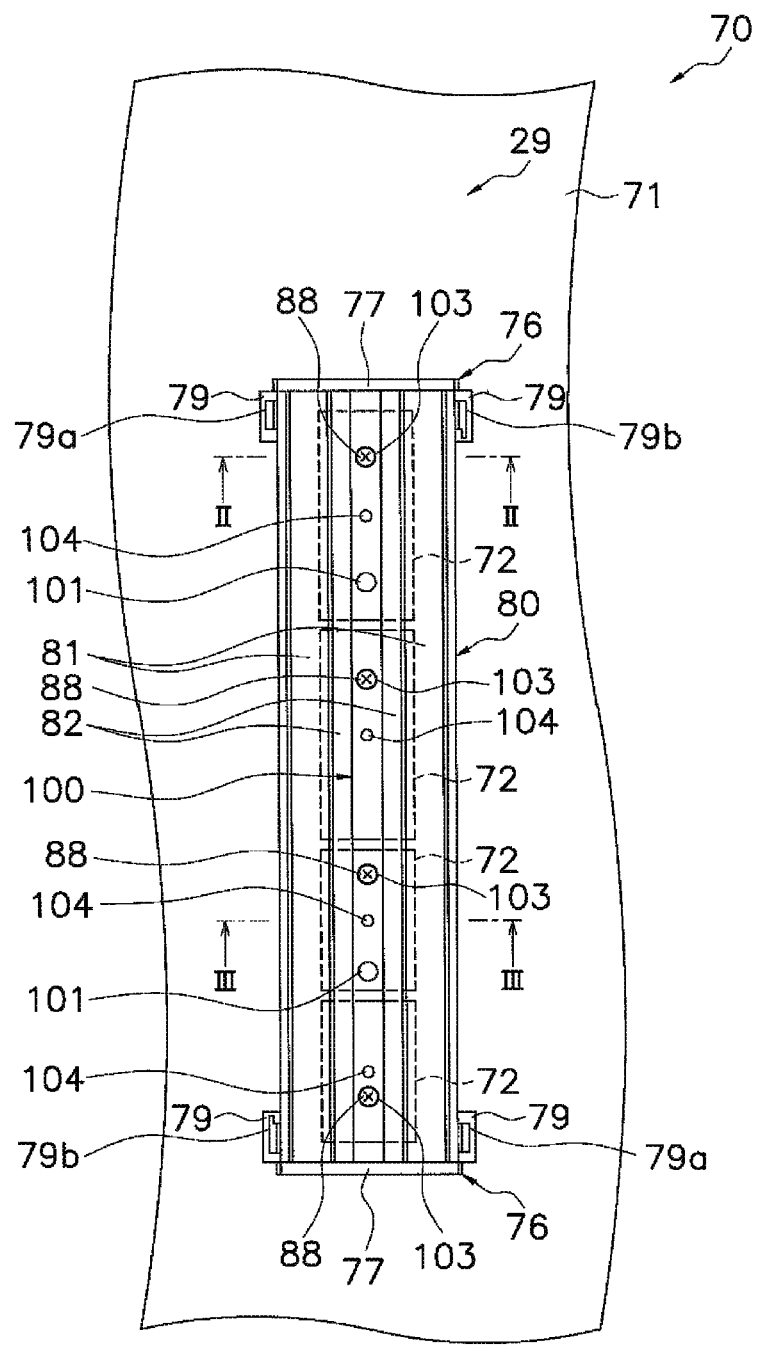
FIG. 6 is a drawing showing a step of assembling the refrigerant jacket and is a front view showing a state in which a refrigerant cooling member is supported on a base plate.
Figure 7:
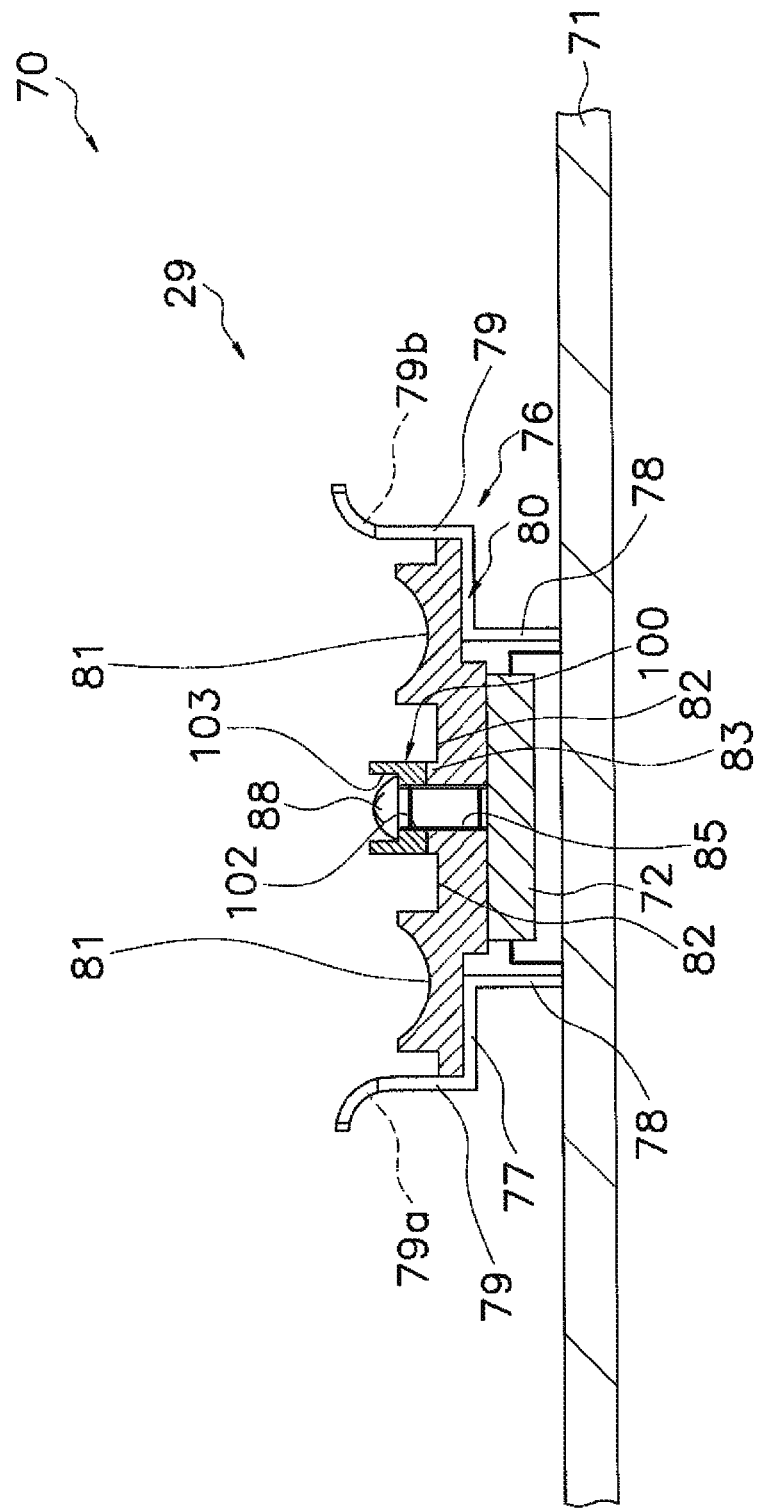
FIG. 7 is a sectional view taken along line II-II of FIG. 6.
Figure 8:
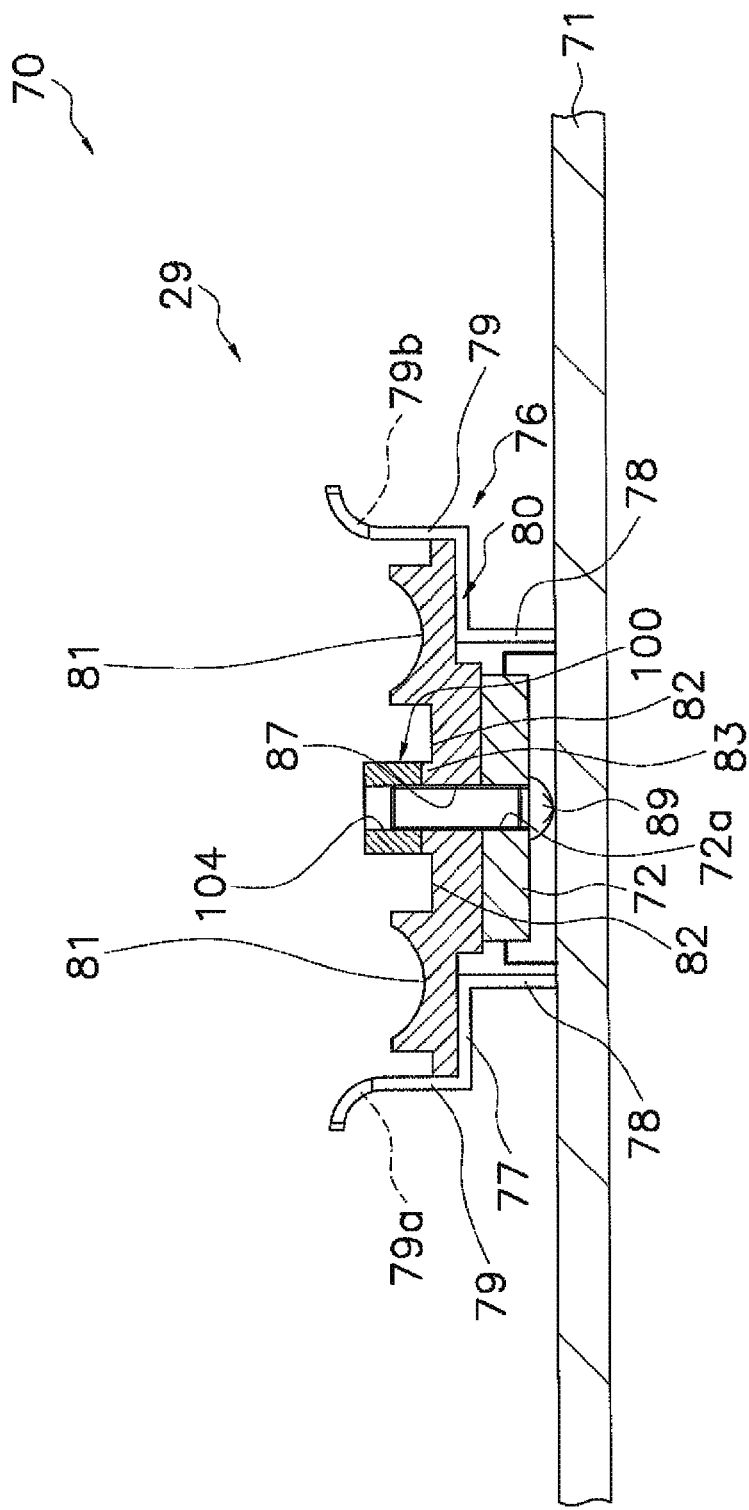
FIG. 8 is a sectional view taken along line III-III of FIG. 6.
Figure 9:
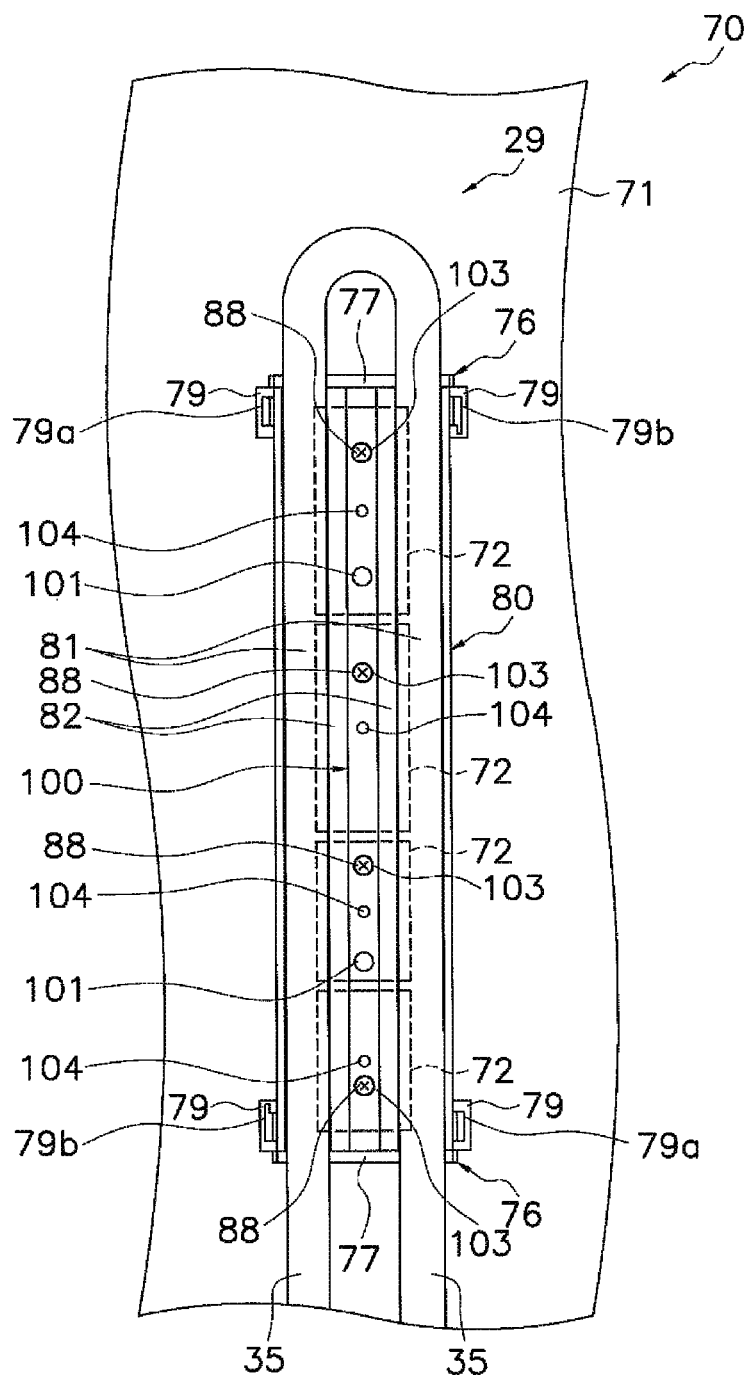
FIG. 9 is a drawing showing a step of assembling the refrigerant jacket and is a front view showing a state in which a liquid refrigerant tube has been fitted into groove portions of the refrigerant cooling member.
Figure 10:
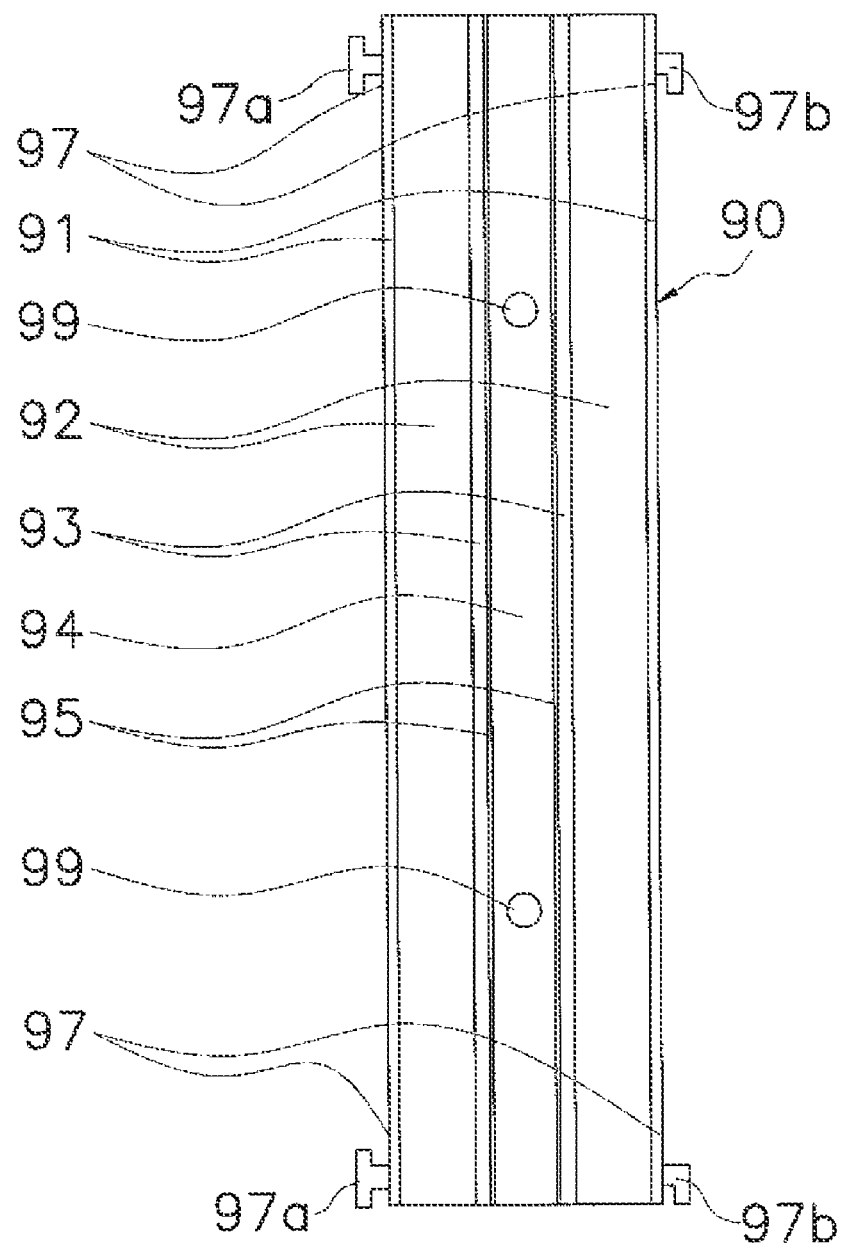
FIG. 10 is a front view of a cover member.
Figure 11:
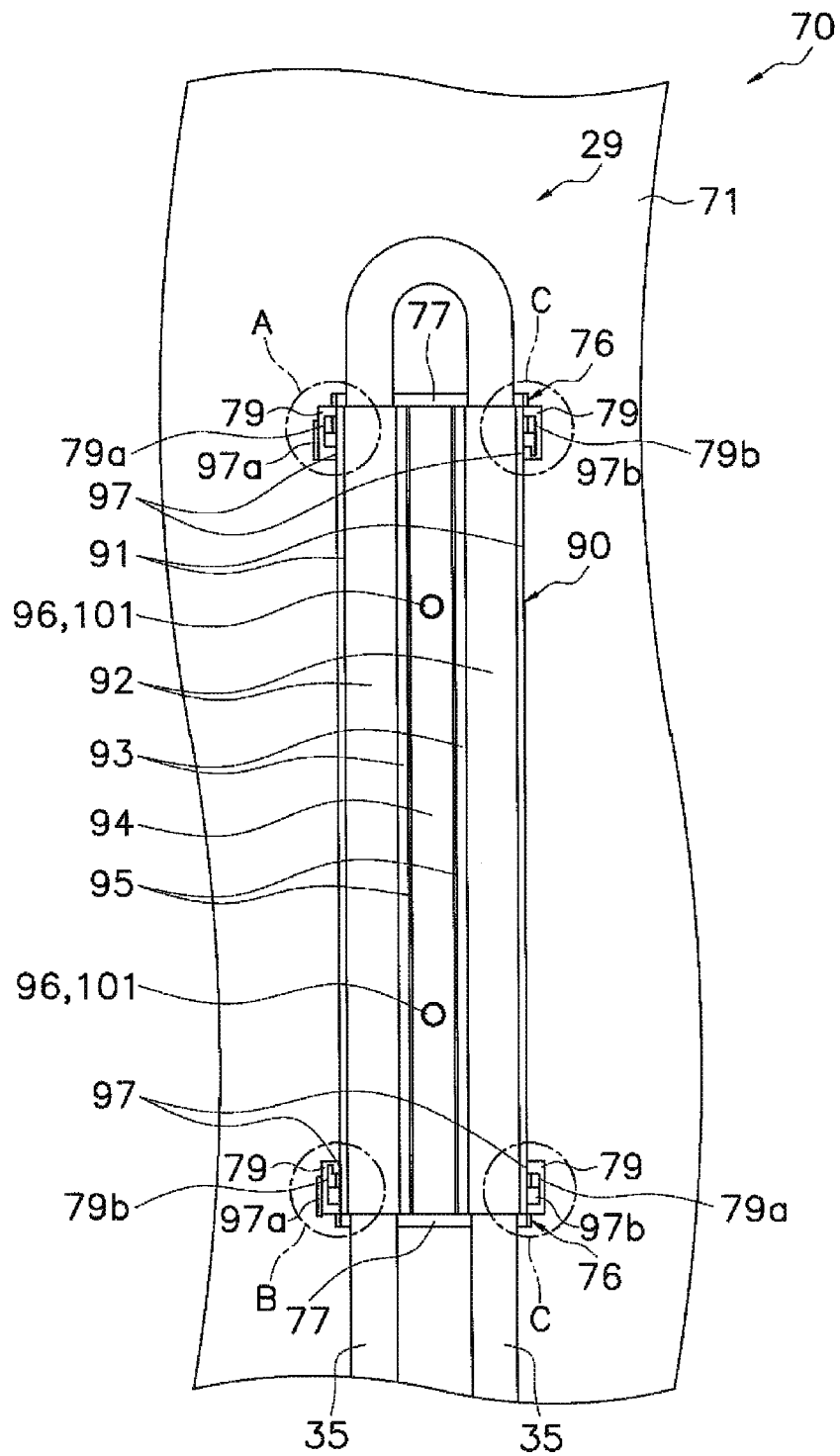
FIG. 11 is a drawing showing a step of assembling the refrigerant jacket and is a front view showing a state in which the refrigerant cooling member is covered with the cover member.
Figure 12:
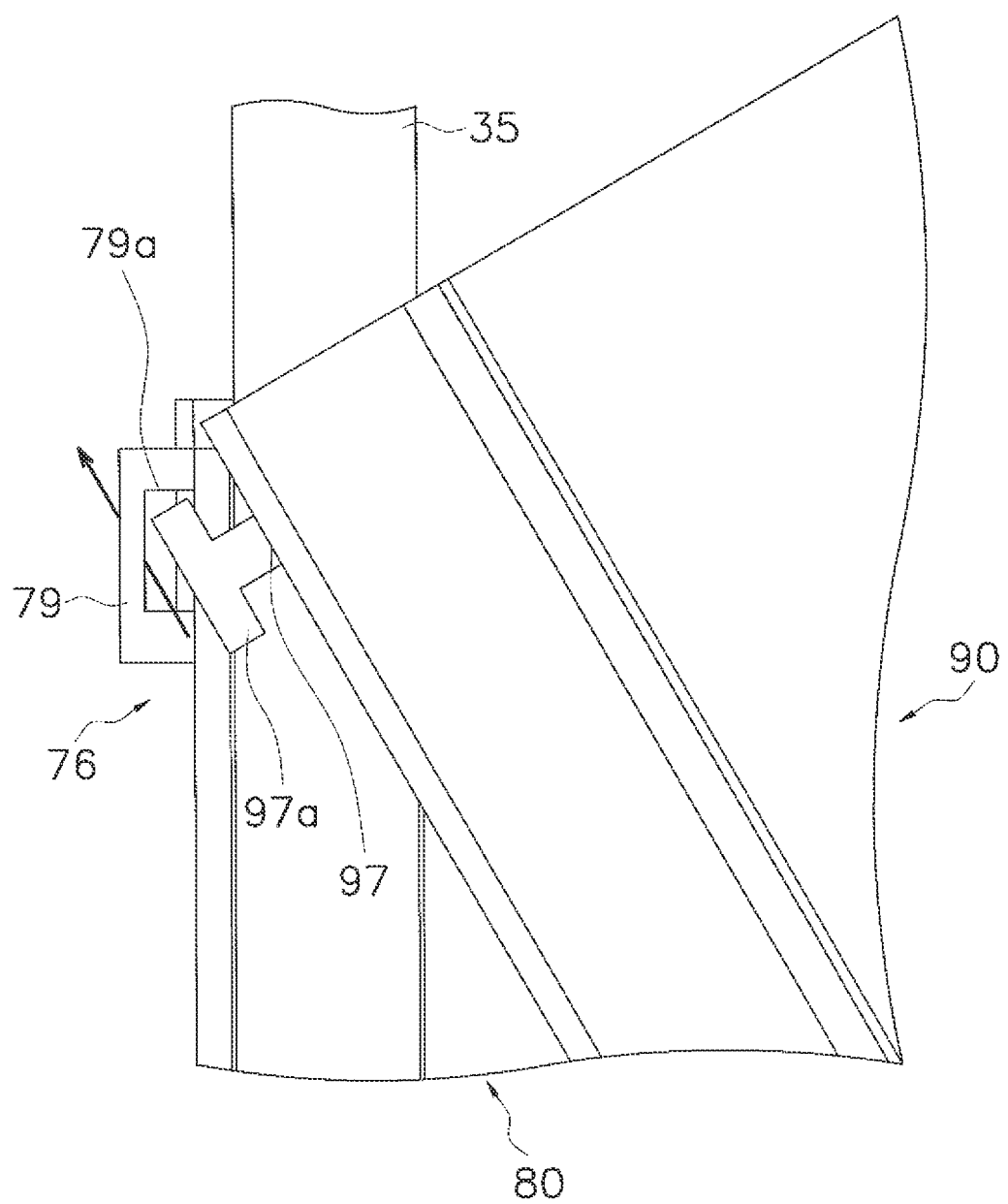
FIG. 12 is a drawing showing a step of assembling the refrigerant jacket and is a drawing describing the work of assembling section A of FIG. 11.
Figure 13:
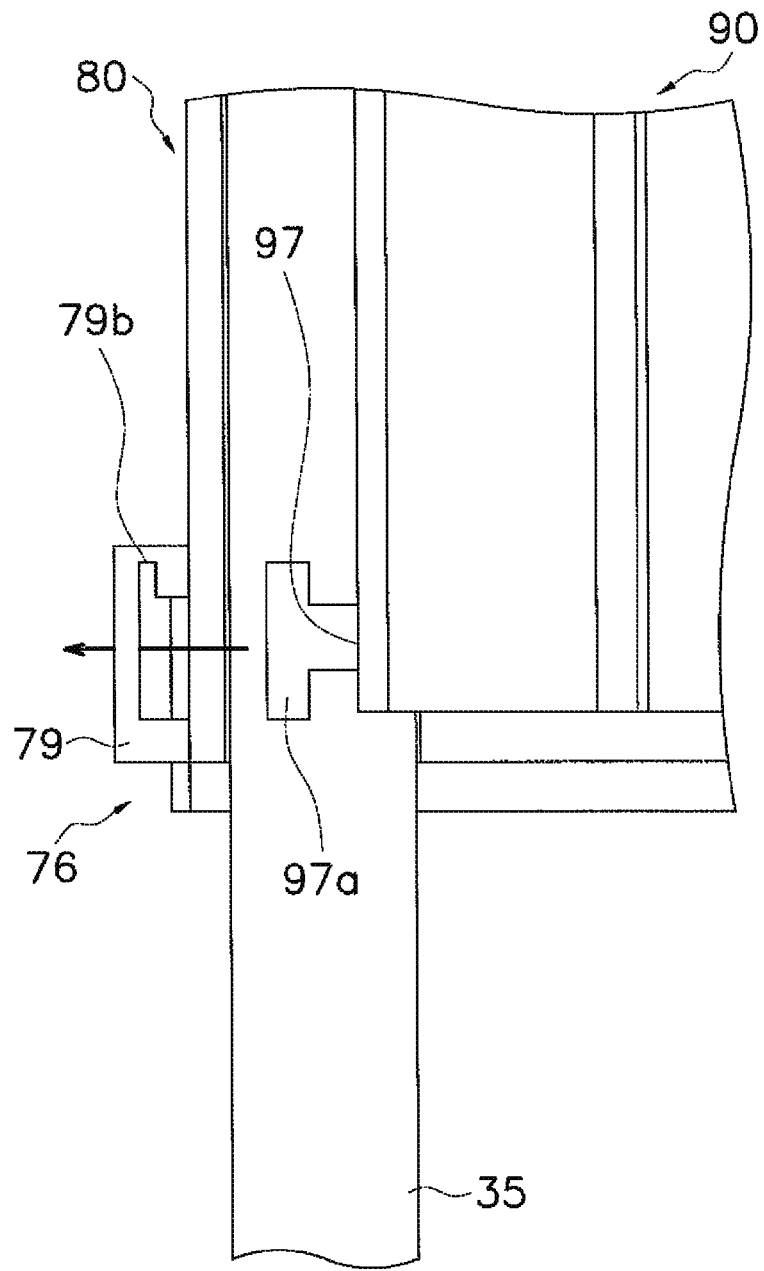
FIG. 13 is a drawing showing a step of assembling the refrigerant jacket and is a drawing describing the work of assembling section B of FIG. 11.
Figure 14:
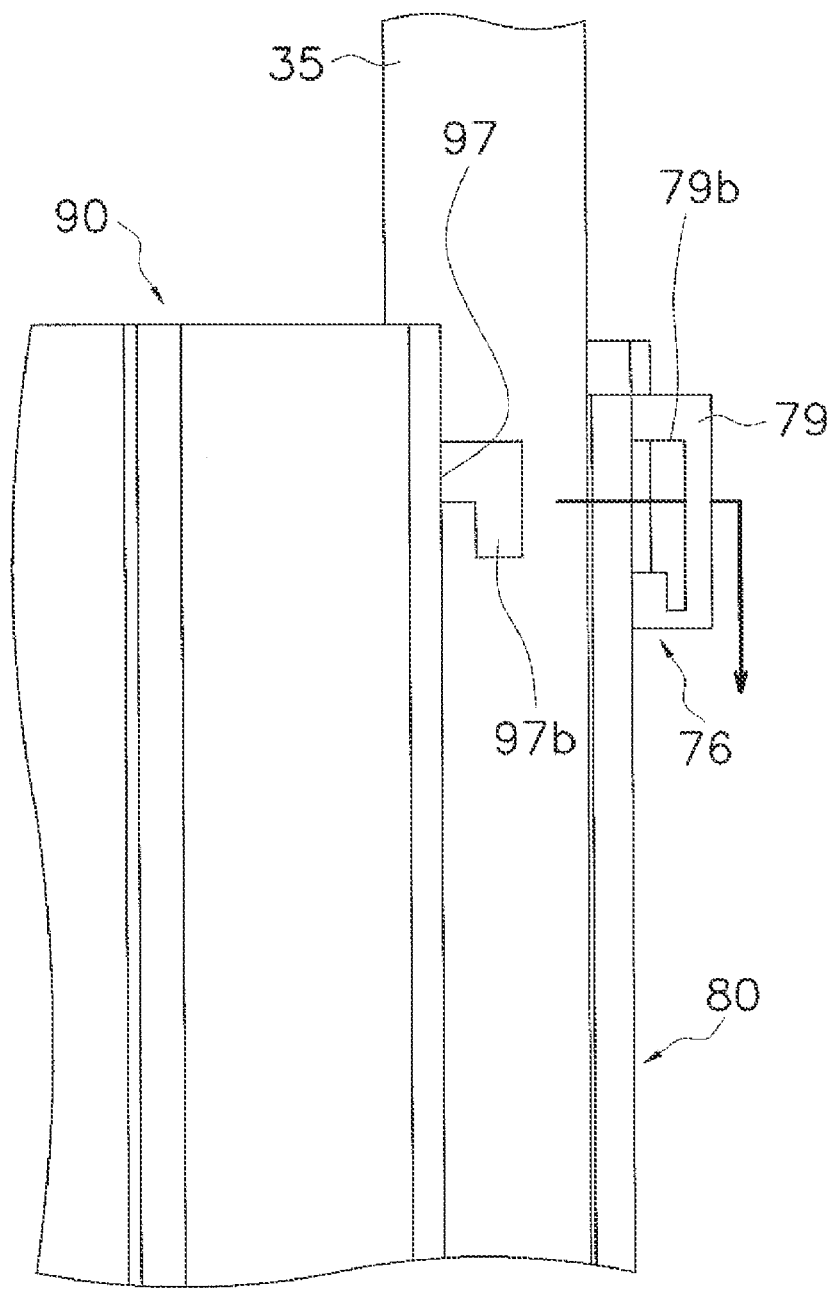
FIG. 14 is a drawing showing a step of assembling the refrigerant jacket and is a drawing describing the work of assembling section C of FIG. 11.

Next, the detailed structure of the refrigerant jacket 29 will be described using FIG. 2 to FIG. 14. Here, FIG. 4 is a front view of the refrigerant jacket 29. FIG. 5 is a sectional view taken along line I-I of FIG. 4. FIG. 6 is a drawing showing a step of assembling the refrigerant jacket 29 and is a front view showing a state in which a refrigerant cooling member 80 is supported on the base plate 71. FIG. 7 is a sectional view taken along line II-II of FIG. 6. FIG. 8 is a sectional view taken along line III-III of FIG. 6. FIG. 9 is a drawing showing a step of assembling the refrigerant jacket 29 and is a front view showing a state in which the liquid refrigerant tube 35 has been fitted into groove portions 81 of the refrigerant cooling member 80. FIG. 10 is a front view of a cover member 90. FIG. 11 is a drawing showing a step of assembling the refrigerant jacket 29 and is a front view showing a state in which the refrigerant cooling member 80 is covered with the cover member 90. FIG. 12 is a drawing showing a step of assembling the refrigerant jacket 29 and is a drawing describing the work of assembling section A of FIG. 11. FIG. 13 is a drawing showing a step of assembling the refrigerant jacket 29 and is a drawing describing the work of assembling section B of FIG. 11. FIG. 14 is a drawing showing a step of assembling the refrigerant jacket 29 and is a drawing describing the work of assembling section C of FIG. 11. In the following description, expressions describing directions and surfaces—such as "upper," "lower," "left," and "right," as well as "front surface," "side surface," "back surface," "top surface," and "bottom surface"—will, unless otherwise indicated, mean directions and surfaces in a case where the outdoor unit 2 shown in FIG. 3 (the refrigerant jacket 29 of FIG. 4 corresponding thereto) is viewed from the front.

As described above, the refrigerant jacket 29 uses the refrigerant circulating through the refrigerant circuit 10 (here, the refrigerant flowing through the refrigerant tube 35) to cool the heat emitting electrical parts 72. The refrigerant jacket 29 mainly has a refrigerant cooling member 80 and a cover member 90.

The refrigerant cooling member 80 is a member with a vertically long shape made of aluminum or aluminum alloy that thermally contacts the heat emitting electrical parts 72 and in which are formed groove portions 81 into which a refrigerant tube configuring the refrigerant circuit 10 (here, the liquid refrigerant tube 35) fits. The refrigerant cooling member 80 is disposed in such a way that its back surface contacts the front surface sides of the heat emitting electrical parts 72 mounted on the base plate 71. The refrigerant cooling member 80 is supported on the base plate 71 via support members 76. Here, the support members 76 are members fixed by fitting or screwing or the like to the upper end and lower end of the refrigerant cooling member 80. In order to support the refrigerant cooling member 80 on the base plate 71, each support member 76 has a body portion 77 to which the refrigerant cooling member 80 is fixed and leg portions 78 that extend from the body portion 77 toward the back surface side and are fixed by insertion, for example, to the base plate 71. A pair of groove portions 81, a pair of V-opposing recessed portions 82, and a middle portion 83 are formed in the front surface of the refrigerant cooling member 80. The pair of groove portions 81 extend in the up and down direction along the straight tube portions of the liquid refrigerant tube 35. The groove portions 81 are formed in such a way that their cross sections have substantially circular arcuate shapes, and parts of the outer peripheral surface of the liquid refrigerant tube 35 fit into the groove portions 81. Grease for promoting thermal conduction is applied between the liquid refrigerant tube 35 and the groove portions 81. The pair of V-opposing recessed portions 82 are disposed between the pair of groove portions 81 in the right and left direction and extend in the up and down direction substantially parallel to the groove portions 81. The middle portion 83 is disposed between the pair of V-opposing recessed portions 82 in the right and left direction and extends in the up and down direction substantially parallel to the groove portions 81 and the V-opposing recessed portions 82.

The cover member 90 is a member with a vertically long shape made of steel that covers the refrigerant cooling member 80 in a state in which the refrigerant tube (here, the liquid refrigerant tube 35) has been fitted into the groove portions 81. The cover member 90 is disposed opposing the refrigerant cooling member 80. The cover member 90 straddles the pair of groove portions 81 of the refrigerant cooling member 80. The cover member 90 has, as sections covering the refrigerant cooling member 80 from the front surface side, a pair of outside plate portions 91, a pair of opposing portions 92, a pair of inside plate portions 93, an attachment plate portion 94, and a pair of folded-back portions 95. The outside plate portions 91 are formed on both right and left direction end sides of the cover member 90. The outside plate portions 91 are tabular sections bent from the opposing portions 92 toward both right and left direction end sides of the refrigerant cooling member 80. The opposing portions 92 are tabular sections that oppose the straight tube portions of the liquid refrigerant tube 35—that is, the groove portions 81 of the refrigerant cooling member 80—and substantially linearly contact the outer peripheral surface of the liquid refrigerant tube 35. The inside plate portions 93 are formed on the right and left direction middle sides of the opposing portions 92. The inside plate portions 93 are tabular sections bent from the opposing portions 92 toward the V-opposing recessed portions 82 of the refrigerant cooling member 80. The attachment plate portion 94 is a tabular section interposed between the pair of inside plate portions 93 in the right and left direction. The attachment plate portion 94 opposes the middle portion 83 of the refrigerant cooling member 80. The folded-back portions 95 are formed between the inside plate portions 93 and the attachment plate portion 94 in the right and left direction and are sections that project in substantial V-shapes toward the V-opposing recessed portions 82 of the refrigerant cooling member 80.

Additionally, a strength member 100 higher in strength than the refrigerant cooling member 80 made of aluminum or aluminum alloy is fixed to the refrigerant cooling member 80. Here, the strength member 100 is a member made of zinc- or tin-plated steel or stainless steel and does not electrically corrode even when it contacts the refrigerant cooling member 80, the cover member 90 made of steel, and the refrigerant tube 35 made of copper. The strength member 100 here is a vertically long rod-like member that opposes the front surface of the middle portion 83 of the refrigerant cooling member 80. Furthermore, the strength member 100 opposes the back surface of the attachment plate portion 94 of the cover member 90 in a state in which the refrigerant cooling member 80 is covered with the cover member 90. Furthermore, strength-side through holes 102 including through holes are formed in the strength member 100 in positions opposing the refrigerant cooling member 80 (here, in sections opposing the middle portion 83 of the refrigerant cooling member 80). Here, there are four strength-side through holes 102 disposed apart from one another in the up and down direction. The number of the strength-side through holes 102 is not limited to four and, for example, may also be one to three in a case where the vertical direction dimension of the cover member 90 is short or may also be five or more in a case where the vertical direction dimension of the cover member 90 is long. Strength member fixing screw holes 85 including screw holes having threads are formed in the refrigerant cooling member 80 in positions opposing the strength-side through holes 102. The strength member 100 is fixed to the refrigerant cooling member 80 as a result of being fastened by strength member fixing screws 88 including screws that pass through the strength-side through holes 102 and screw into the strength member fixing screw holes 85. Moreover, here, first strength-side recessed portions 103 including recesses that accommodate head portions of the strength member fixing screws 88 in a state in which the strength member 100 has been fastened and fixed to the refrigerant cooling member 80 are formed in the strength member 100. Furthermore, heat emitting electrical part fixing screw holes 87 including screw holes having threads are formed in the refrigerant cooling member 80 in positions opposing the heat emitting electrical parts 72 (here, in the middle portion 83 of the refrigerant cooling member 80). The heat emitting electrical parts 72 are fastened and fixed to the refrigerant cooling member 80 by heat emitting electrical part fixing screws 89 including screws that screw into the heat emitting electrical part fixing screw holes 87. Specifically, heat emitting electrical part-side through holes 72a through which the heat emitting electrical part fixing screws 89 can be inserted are formed in the heat emitting electrical parts 72 in positions opposing the heat emitting electrical part fixing screw holes 87, and the heat emitting electrical parts 72 are fastened and fixed to the refrigerant cooling member 80 by passing the heat emitting electrical part fixing screws 89 through the heat emitting electrical part-side through holes 72a and screwing them into the heat emitting electrical part fixing screw holes 87. Here, the heat emitting electrical part fixing screw holes 87 penetrate the refrigerant cooling member 80. Second strength-side recessed portions 104 including through holes are formed in the strength member 100 in positions opposing the heat emitting electrical part fixing screw holes 87. The second strength-side recessed portions 104 do not have to be through holes that oppose and are communicated with the heat emitting electrical part fixing screw holes 87 and may also, for example, be recesses that oppose and are communicated with the heat emitting electrical part fixing screw holes 87.

Additionally, cover-side through holes 96 including through holes are formed in the cover member 90 in positions opposing the strength member 100 (here, in the attachment plate portion 94). Here, the cover-side through holes 96 are through holes through which cover member fixing screws 99 including screws can be inserted. Here, there are two cover-side through holes 96 disposed apart from one another in the up and down direction. The number of the cover-side through holes 96 is not limited to two and, for example, may also be just one in a case where the vertical direction dimension of the cover member 90 is short or may also be three or four or more in a case where the vertical direction dimension of the cover member 90 is long. Furthermore, cover member fixing screw holes 101 including screw holes having threads are formed in the strength member 100 in positions opposing the cover-side through holes 96. Here, the cover member fixing screw holes 101 are screw holes into which the cover member fixing screws 99 including screws are screwed. Additionally, the cover member 90 is fastened and fixed to the strength member 100 by passing the cover member fixing screws 99 through the cover-side through holes 96 and screwing them into the cover member fixing screw holes 101. Moreover, here, the cover member fixing screw holes 101 penetrate the strength member 100. First refrigerant cooling-side recessed portions 84 including recesses are formed in the refrigerant cooling member 80 in positions opposing the cover member fixing screw holes 101 (here, in the middle portion 83 of the refrigerant cooling member 80). The first refrigerant cooling-side recessed portions 84 do not have to be recessed portions that oppose and are communicated with the cover member fixing screw holes 101 and may also, for example, be through holes that oppose and are communicated with the cover member fixing screw holes 101.

The refrigerant jacket 29 with the structure described above including the refrigerant cooling member 80, the cover member 90, and the strength member 100 is assembled by fitting the liquid refrigerant tube 35 into the groove portions 81 of the refrigerant cooling member 80 to which the strength member 100 has been fixed, so that the liquid refrigerant tube 35 thermally contacts the heat emitting electrical parts 72 (see FIG. 9), covering the refrigerant cooling member 80 with the cover member 90 (see FIG. 11), and thereafter inserting the cover member fixing screws 99 through the cover-side through holes 96 and screwing them into the cover member fixing screw holes 101 to thereby fix the cover member 90 to the strength member 100 (see FIG. 4). Moreover, here, the following structure is also employed in order to improve the assemblability of the refrigerant jacket 29. Specifically, in a state in which the refrigerant cooling member 80 is covered with the cover member 90 but the cover member 90 is not fixed by the cover member fixing screws 99 to the strength member 100 (see FIG. 11), the cover member 90 is restrained in such a way that it does not move in a predetermined direction (here, the right and left direction) in relation to the refrigerant cooling member 80. Here, outer restraining portions 79 are disposed on the support members 76. The outer restraining portions 79 are a pair of plate-like sections that extend from both right and left direction ends of the body portions 77 of the support members 76 toward the cover member 90, and the outer restraining portions 79 have shapes in which their end portions on the front surface side curve outward in the right and left direction. Additionally, a pair of tabular restrained portions 97 that extend from both right and left direction ends of the outside plate portions 91 toward the refrigerant cooling member 80 are further formed on the cover member 90, and when the refrigerant cooling member 80 has been covered with the cover member 90, the restrained portions 97 are positioned between the outer restraining portions 79 in the right and left direction, whereby the cover member 90 is restrained in such a way that it does not move in a predetermined direction (here, the right and left direction) in relation to the refrigerant cooling member 80. Furthermore, here, claw portions 97a and 97b that project outward in the right and left direction are formed by cutting-and-raising, for example, on the restrained portions 97. Moreover, slits 79a and 79b are formed in the curved sections of the outer restraining portions 79. As shown in FIG. 11 to FIG. 14, the claw portions 97a and 97b are inserted into the slits 79a and 79b and the cover member 90 is slid downward, whereby the cover member 90 can be provisionally fastened to the refrigerant cooling member 80. Specifically, first, as shown in FIG. 12, the T-shaped claw portion 97a on the upper left side is diagonally inserted into the slit 79a. Next, as shown in FIG. 13, the T-shaped claw portion 97a on the lower left side is inserted into the slit 79b. Then, as shown in FIG. 14, the L-shaped claw portions 97b on the upper right side and the lower right side are inserted into the slits 79b and 79a (FIG. 14 shows the insertion of the claw portion 97b on the upper right side into the slit 79b but does not show the insertion of the claw portion 97b on the lower right side into the slit 79a). Thereafter, the cover member 90 is slid downward in relation to the refrigerant cooling member 80 so that the claw portions 97a and 97b engage with the slits 79a and 79b, whereby the cover member 90 is provisionally fastened to the refrigerant cooling member 80.

(5) Characteristics of Refrigerant Jacket and Air Conditioning Apparatus Equipped Therewith The refrigerant jacket 29 of the present embodiment and the air conditioning apparatus 1 equipped therewith have the following characteristics.

Here, as described above (in particular, see FIG. 4 and FIG. 5), the refrigerant jacket 29 that uses the refrigerant circulating through the refrigerant circuit 10 to cool the heat emitting electrical parts 72 has the refrigerant cooling member 80 and the cover member 90. The refrigerant cooling member 80 is a member made of aluminum or aluminum alloy that thermally contacts the heat emitting electrical parts 72 and in which are formed the groove portions 81 into which a refrigerant tube configuring the refrigerant circuit 10 fits. The cover member 90 is a member that covers the refrigerant cooling member 80 in a state in which the refrigerant tube has been fitted into the groove portions 81. Additionally, the strength member 100 higher in strength than the refrigerant cooling member 80 is fixed to the refrigerant cooling member 80. The cover-side through holes 96 including through holes are formed in the cover member 90 in positions opposing the strength member 100. The cover member fixing screw holes 101 including screw holes having threads are formed in the strength member 100 in positions opposing the cover-side through holes 96. The cover member 90 is fixed and fastened to the strength member 100 by the cover member fixing screws 99 including screws that pass through the cover side through holes 96 and screw into the cover member fixing screw holes 101. That is, here, the strength member 100 higher in strength than the refrigerant cooling member 80 is fixed to the refrigerant cooling member 80, the cover member fixing screw holes 101 are formed in the strength member 100, and the cover member 90 is fastened and fixed to the strength member 100 by the cover member fixing screws 99.

Because of this, here, the threads of the cover member fixing screw holes 101 no longer strip even due to repeated screwing and excessive tightening of the cover member fixing screws 99, and the cover member 90 can be fixed to the refrigerant cooling member 80 in a state in which the refrigerant tube and the groove portions 81 of the refrigerant cooling member 80 are in sufficiently close contact with one another.

Furthermore, here, as described above, the strength member 100 is a member that does not electrically corrode even when it contacts the refrigerant cooling member 80, the cover member 90, and the refrigerant tube (here, the liquid refrigerant tube 35).

Because of this, here, damage caused by electrical corrosion of the refrigerant jacket 29 can be suppressed.

Moreover, here, as described above, the cover member fixing screw holes 101 penetrate the strength member 100. The first refrigerant cooling-side recessed portions 84 including recesses or through holes are formed in the refrigerant cooling member 80 in positions opposing the cover member fixing screw holes 101.

Because of this, here, the hole depth of the cover member fixing screw holes 101 can be increased and the distal end portions of the cover member fixing screws 99 can be accommodated in the first refrigerant cooling-side recessed portions 84. Additionally, the fastening strength between the cover member 90 and the strength member 100 can be improved and interference between the cover member fixing screws 99 and the refrigerant cooling member 80 can be avoided.

Here, as described above (in particular, see FIG. 6 and FIG. 7), the strength-side through holes 102 including through holes are formed in the strength member 100 in positions opposing the refrigerant cooling member 80. The strength member fixing screw holes 85 including screw holes having threads are formed in the refrigerant cooling member 80 in positions opposing the strength-side through holes 102. The strength member 100 is fixed to the refrigerant cooling member 80 as a result of being fastened by the strength member fixing screws 88 including screws that pass through the strength-side through holes 102 and screw into the strength member fixing screw holes 85.

Because of this, here, the strength member 100 can be strongly and easily fixed to the refrigerant cooling member 80.

Moreover, here, as described above, the first strength-side recessed portions 103 including recesses that accommodate the head portions of the strength member fixing screws 88 in a state in which the strength member 100 has been fastened and fixed to the refrigerant cooling member 80 are formed in the strength member 100.

Because of this, here, interference between the head portions of the strength member fixing screws 88 and the cover member 90 can be avoided.

Here, as described above (in particular, see FIG. 6 and FIG. 8), the heat emitting electrical part fixing screw holes 87 including screw holes having threads are formed in the refrigerant cooling member 80 in positions opposing the heat emitting electrical parts 72. The heat emitting electrical parts 72 are fastened and fixed to the refrigerant cooling member 80 by the heat emitting electrical part fixing screws 89 including screws that screw into the heat emitting electrical part fixing screw holes 87. The heat emitting electrical part fixing screw holes 87 penetrate the refrigerant cooling member 80. The second strength-side recessed portions 104 including recesses or through holes are formed in the strength member 100 in positions opposing the heat emitting electrical part fixing screw holes 87.

Because of this, here, the hole depth of the heat emitting electrical part fixing screw holes 87 can be increased and the distal end portions of the heat emitting electrical part fixing screws 89 can be accommodated in the second strength-side recessed portions 104. Additionally, the fastening strength between the refrigerant cooling member 80 and the heat emitting electrical parts 72 can be improved and interference between the heat emitting electrical part fixing screws 89 and the strength member 100 can be avoided.

(6) Example Modifications

The refrigerant jacket 29 of the above-described embodiment employs a structure where a vertically long rod-like member opposing the front surface of the middle portion 83 of the refrigerant cooling member 80 is used as the strength member 100 and where the strength member 100 is fixed to the refrigerant cooling member 80 by the strength member fixing screws 88. However, the strength member 100 is not limited to a member with the above-described shape.

Figure 15:
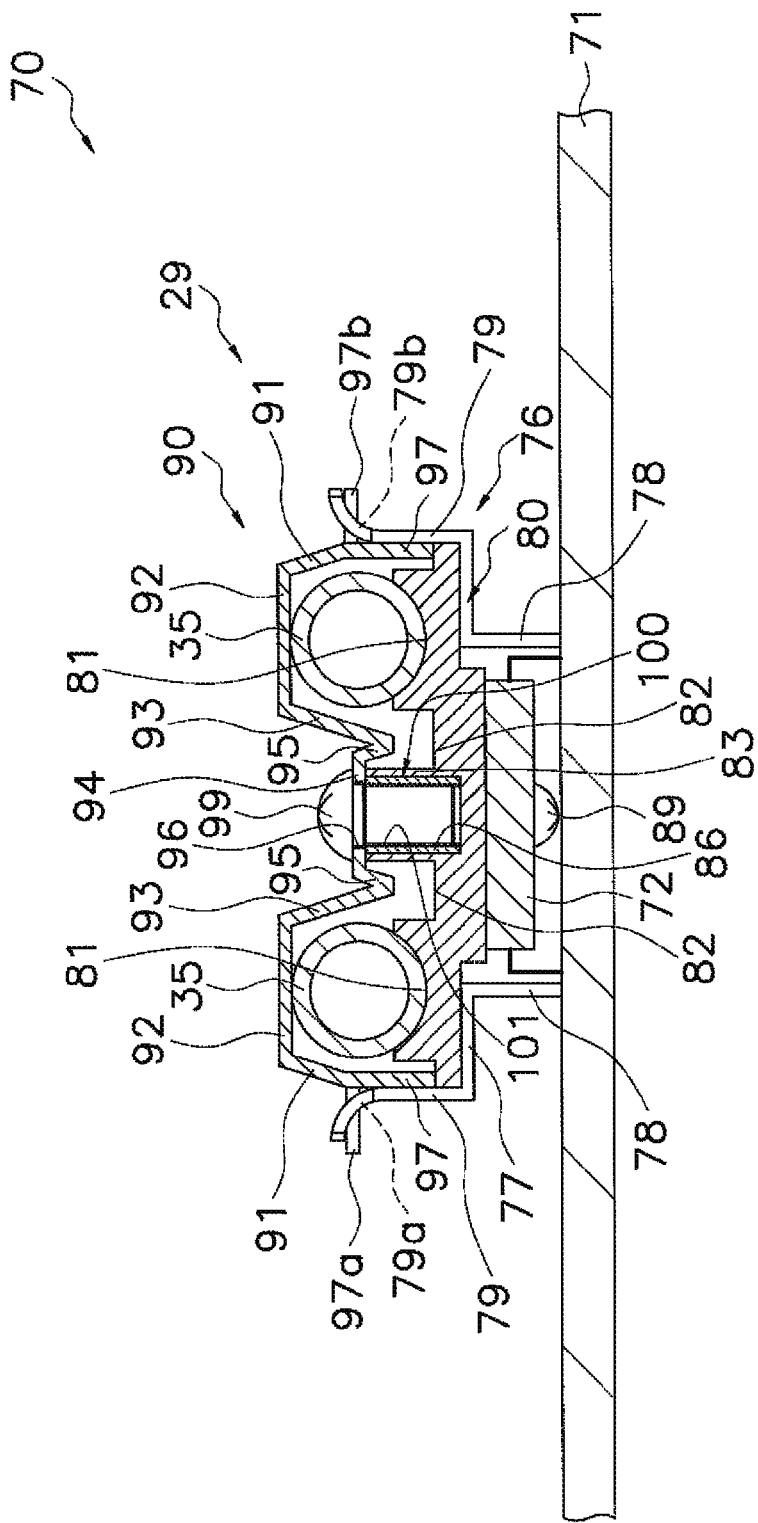
FIG. 15 shows an example modification of the refrigerant jacket and is a drawing corresponding to FIG. 5.
Figure 16:
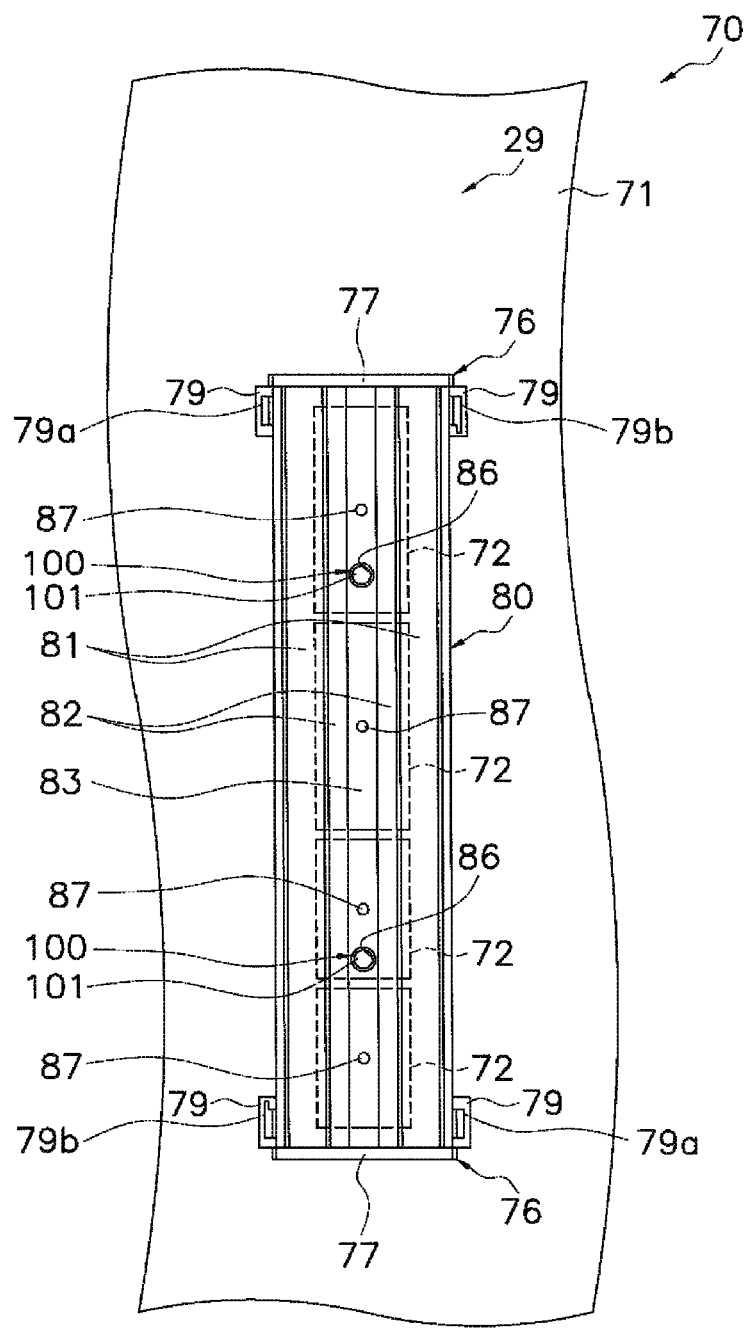
FIG. 16 shows the example modification of the refrigerant jacket and is a drawing corresponding to FIG. 6.

For example, as shown in FIG. 15 and FIG. 16, the refrigerant jacket 29 may also employ a structure where second refrigerant cooling-side recessed portions 86 including recesses into which strength members 100 fit are formed in the refrigerant cooling member 80 and where the strength members 100 are fixed to the refrigerant cooling member 80 as a result of being press-fitted into the second refrigerant cooling-side recessed portions 86. That is, the refrigerant jacket 29 may also employ a structure where only the sections of the refrigerant cooling member 80 opposing the cover-side through holes 96 of the cover member 90 are used as strength members 100 and where the cover member fixing screw holes 101 are formed in the strength members 100.

In this case also, the same action and effects as those of the above-described embodiment can be obtained, and the strength members 100 can be strongly and easily fixed to the refrigerant cooling member 80.

The refrigerant jacket 29 of the above-described embodiment employs a structure where the claw portions 97a and 97b and the slits 79a and 79b are utilized as a structure for provisionally fastening the cover member 90 to the refrigerant cooling member 80, but the refrigerant jacket 29 is not limited to this and may also employ another provisional fastening structure. Furthermore, the refrigerant jacket 29 does not have to employ this provisional fastening structure.

The refrigerant jacket 29 of the above-described embodiment has a vertically long shape in the outdoor unit 2, but the refrigerant jacket 29 is not limited to this and may also have a transversely long shape.

The refrigerant jacket 29 of the above-described embodiment uses the refrigerant flowing through the liquid refrigerant tube 35 to cool the heat emitting electrical parts 72, but the refrigerant jacket 29 is not limited to this and may also use the refrigerant flowing through another refrigerant tube of the refrigerant circuit 10 to cool the heat emitting electrical parts 72.

What is claimed is:

1. A refrigerant jacket that uses refrigerant circulating through a refrigerant circuit to cool a heat emitting electrical part, the refrigerant jacket comprising:
    a refrigerant cooling member constructed of aluminum or aluminum alloy that thermally contacts the heat emitting electrical part, the refrigerant cooling member having a groove portion formed within the refrigerant cooling member, a refrigerant tube of the refrigerant circuit fitting into the groove portion, and the heat emitting electrical part being fixed to the refrigerant cooling member by a heat emitting electrical part fixing screw screwed into threads of a heat emitting electrical part fixing screw hole of the refrigerant cooling member;
    a cover member covering the refrigerant cooling member in a state in which the refrigerant tube has been fitted into the groove portion; and
    a strength member higher in strength than the refrigerant cooling member, the strength member being fixed to the refrigerant cooling member by a strength member fixing screw screwed into threads of a strength member fixing screw hole of the refrigerant cooling member,
    the cover member having a cover-side through hole formed within the cover member in a position opposing the strength member,
    the strength member having a cover member fixing screw hole formed within the strength member in a position opposing the cover-side through hole, the cover member fixing screw hole having threads, and
    the cover member being fastened and fixed to the strength member by a cover member fixing screw that passes through the cover-side through hole and screws into the threads of the cover member fixing screw hole of the strength member.

2. The refrigerant jacket according to claim 1, wherein the strength member is constructed such that the strength member does not electrically corrode even when contacting the refrigerant cooling member, the cover member, and the refrigerant tube.

3. The refrigerant jacket according to claim 1, wherein the cover member fixing screw hole of the strength member is a through hole, and
    the refrigerant cooling member has a refrigerant cooling-side recessed portion formed within the refrigerant cooling member in a position opposing the cover member fixing screw hole, and the refrigerant cooling-side recessed portion defines a recess or second through hole.

4. The refrigerant jacket according to claim 1, wherein the strength member has a strength-side through hole formed within the strength member in a position opposing the strength member fixing screw hole in the refrigerant cooling member, and the strength member fixing screw passes through the strength-side through hole and is screwed into the threads of the strength member fixing screw hole.

5. The refrigerant jacket according to claim 4, wherein the strength member has a strength-side recessed portion formed within the strength member that accommodates a head portion of the strength member fixing screw in a state in which the strength member has been fastened and fixed to the refrigerant cooling member, and the strength-side recessed portion defines a recess.

6. The refrigerant jacket according to claim 1, wherein the refrigerant cooling member has a refrigerant cooling-side recessed portion formed within the refrigerant cooling member, the refrigerant cooling-side recessed portion defines a recess, and the strength member fits into the recess, and the strength member is fixed to the refrigerant cooling member by press fitting the strength member into the recess of the refrigerant cooling-side recessed portion.

7. The refrigerant jacket according to claim 1, wherein
the heat emitting electrical part fixing screw hole of the refrigerant cooling member is a through hole, and
the strength member has a strength-side recessed portion formed within the strength member in a position opposing the heat emitting electrical part fixing screw hole, and the strength-side recessed portion defines a recess or a second through hole.

8. An air conditioning apparatus comprising:
a refrigerant circuit;
a heat emitting electrical part; and
a refrigerant jacket that uses refrigerant circulating through the refrigerant circuit to cool the heat emitting electrical part, the refrigerant jacket including
a refrigerant cooling member constructed of aluminum or aluminum alloy that thermally contacts the heat emitting electrical part, the refrigerant cooling member having a groove portion formed within the refrigerant cooling member, a refrigerant tube of the refrigerant circuit fitting into the groove portion, and the heat emitting electrical part being fixed to the refrigerant cooling member by a heat emitting electrical part fixing screw screwed into threads of a heat emitting electrical part fixing screw hole of the refrigerant cooling member,
a cover member that covers the refrigerant cooling member in a state in which the refrigerant tube has been fitted into the groove portion, and
a strength member higher in strength than the refrigerant cooling member, the strength member being fixed to the refrigerant cooling member by a strength member fixing screw screwed into threads of a strength member fixing screw hole of the refrigerant cooling member,
the cover member having a cover-side through hole formed within the cover member in a position opposing the strength member,
the strength member having a cover member fixing screw hole formed within the strength member in a position opposing the cover-side through hole, the cover member fixing screw hole having threads, and
the cover member being fastened and fixed to the strength member by a cover member fixing screw that passes through the cover-side through hole and screws into the threads of the cover member fixing screw hole of the strength member.

* * * * *